(12) United States Patent
Yamasuge et al.

(10) Patent No.: US 11,312,903 B2
(45) Date of Patent: Apr. 26, 2022

(54) GREEN PHOSPHOR, PHOSPHOR SHEET, AND LIGHT-EMITTING DEVICE

(71) Applicant: Dexerials Corporation, Tokyo (JP)

(72) Inventors: Takehiro Yamasuge, Tokyo (JP); Tsuneo Kusunoki, Tokyo (JP); Moriaki Abe, Tokyo (JP); Masahide Daimon, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/764,961

(22) PCT Filed: Nov. 22, 2018

(86) PCT No.: PCT/JP2018/043273
§ 371 (c)(1),
(2) Date: May 18, 2020

(87) PCT Pub. No.: WO2019/107285
PCT Pub. Date: Jun. 6, 2019

(65) Prior Publication Data
US 2020/0347294 A1    Nov. 5, 2020

(30) Foreign Application Priority Data

Nov. 30, 2017  (JP) ............................. JP2017-230487
Oct. 25, 2018  (JP) ............................. JP2018-200520
Nov. 21, 2018  (JP) ............................. JP2018-217893

(51) Int. Cl.
*C09K 11/77*   (2006.01)
*C09K 11/62*   (2006.01)
*H01L 33/26*   (2010.01)

(52) U.S. Cl.
CPC .......... *C09K 11/62* (2013.01); *C09K 11/7756* (2013.01); *H01L 33/26* (2013.01)

(58) Field of Classification Search
CPC .................................................. C09K 11/7756
See application file for complete search history.

(56) References Cited

U.S. PATENT DOCUMENTS

2009/0050848 A1*  2/2009  Kim ..................... C09K 11/025
                                                              252/301.4 R
2010/0213820 A1*  8/2010  Sakai .................. C04B 35/6268
                                                              313/501
(Continued)

FOREIGN PATENT DOCUMENTS

JP       4343267          7/2009
JP    2009280773 A       12/2009
(Continued)

OTHER PUBLICATIONS

Smet. Thiogallate phosphors for phosphor-converted LEDs: saturated green emission. SID Mid-Europe Chapter Spring Meeting 2013 (Year: 2013).*

(Continued)

*Primary Examiner* — Matthew E. Hoban
(74) *Attorney, Agent, or Firm* — Carmody Torrance Sandak & Hennessey LLP

(57) ABSTRACT

A green phosphor including: (i) an inorganic phosphor particle; and (ii) neodymium-containing particles attached on a surface of the inorganic phosphor particle, wherein the green phosphor has a light-emission local maximum wavelength in a range of from 500 nm to 570 nm.

11 Claims, 11 Drawing Sheets

(56) References Cited

U.S. PATENT DOCUMENTS

| | | | |
|---|---|---|---|
| 2011/0114985 A1 | 5/2011 | Ogawara et al. | |
| 2012/0018674 A1 | 1/2012 | Sasakura et al. | |
| 2015/0197689 A1* | 7/2015 | Tani .................. | C09K 11/7733 |
| | | | 362/84 |

FOREIGN PATENT DOCUMENTS

| | | |
|---|---|---|
| JP | 4708507 | 3/2011 |
| JP | 2015211150 A | 11/2015 |
| JP | 2017186459 A | 10/2017 |
| KR | 20080009416 | 1/2008 |

OTHER PUBLICATIONS

International Search Report dated Jan. 8, 2018 issued in corresponding International Patent Application No. PCT/JP2018/043273.
Written Opinion of the ISA dated Jan. 8, 2018 issued in corresponding International Patent Application No. PCT/JP2018/043273.
Japanese Patent Office, Office Action issued in corresponding Japanese Patent Application No. 2018-217893, dated Jul. 20, 2021.
Extended European Search Report issued in corresponding European Application No. 18882324.9, dated Jul. 9, 2021.
Palo, Emilia et al. "Surface modification of upconverting nanoparticles by layer-by-layer assembled polyelectrolytes and metal ions", Journal of Colloid and Interface Science, vol. 508, pp. 137-144, Aug. 12, 2017.
Japanese Patent Office, Office Action issued in corresponding Japanese Patent Application No. 2018-217893, dated Aug. 3, 2021.
Office action dated Jan. 21, 2022 issued for corresponding Taiwanese application No. 107142040.

* cited by examiner 2.00 μm 2.00 μm

GREEN PHOSPHOR, PHOSPHOR SHEET, AND LIGHT-EMITTING DEVICE

TECHNICAL FIELD

The present invention relates to a green phosphor, a phosphor sheet, and a light-emitting device.

BACKGROUND ART

Conventionally, low-priced TVs and displays have used pseudo white LEDs using yellow phosphor YAG:Ce.

In recent years, liquid crystal TVs and displays have been required to have a wide color gamut. In the above systems, however, the color gamut becomes narrower because they reduce color purities of green and red. In order to widen the color gamut (achieve the wide color gamut), in place of the yellow phosphor, a three-wavelength type white LED is advantageous which uses green emission phosphor and red emission phosphor suitable for the transmission characteristics of a color filter.

A known green light-emitting phosphor having a light-emission local maximum wavelength in the range of from about 500 nm to about 570 nm is, for example, a $SrGa_2S_4$:Eu phosphor. The $SrGa_2S_4$:Eu phosphor is excited by light in the range of from near ultraviolet to blue, and thus has attracted attention as a green light-emitting phosphor for exciting blue LEDs.

In such a green light-emitting phosphor, various studies have been made for improving light-emitting properties thereof. For example, a $SrGa_2S_4$:Eu phosphor or a $MGa_2S_4$:Eu phosphor (M=Ba, Sr and/or Ca) has been proposed for increasing the internal quantum efficiency (e.g., see PTLs 1 and 2).

In the improvements in light-emitting properties of the green light-emitting phosphor, increase in color purity is also demanded.

CITATION LIST

Patent Literature

PTL 1 Japanese Patent (JP-B) No. 4343267
PTL 2 Japanese Patent (JP-B) No. 4708507

SUMMARY OF INVENTION

Technical Problem

The present invention has been proposed under such circumstances and aims to provide a green phosphor having high color purity, and a phosphor sheet and a light-emitting device each using the green phosphor.

Solution to Problem

Means for solving the above-described problems are as follows.
<1> A green phosphor including:
an inorganic phosphor particle; and
neodymium-containing particles attached on a surface of the inorganic phosphor particle,
wherein the green phosphor has a light-emission local maximum wavelength in a range of from 500 nm to 570 nm.
<2> The green phosphor according to <1>, wherein the inorganic phosphor particle has a light-emission local maximum wavelength (λa) in a range of from 500 nm to 570 nm, and a difference (λb−λa) between the light-emission local maximum wavelength (λb) of the green phosphor in the range of from 500 nm to 570 nm and the light-emission local maximum wavelength (λa) is more than 0 nm but is 10 nm or less.
<3> The green phosphor according to <1> or <2>, wherein the inorganic phosphor particle includes a base particle represented by any one of General Formula (1) to General Formula (3) below:

$Sr_{1-x}Ga_2S_4$:$Eu_x$      General Formula (1);

$(Sr_{1-y}Ca_y)_{1-x}Ga_2S_4$:$Eu_x$      General Formula (2); and $(Ba_zSr_{1-z})_{1-x}Ga_2S_4$:$Eu_x$      General Formula (3), where in the General Formulas (1) to (3), x satisfies 0<x<1, y satisfies 0<y<1, and z satisfies 0<z<1.
<4> The green phosphor according to <1> or <2>, wherein the inorganic phosphor particle contains a base particle that is a Eu-activated β-SiALON phosphor particle.
<5> The green phosphor according to any one of <1> to <4>, wherein the neodymium-containing particles contain at least one selected from the group consisting of neodymium hydroxide, neodymium oxide carbonate, and neodymium oxide.
<6> The green phosphor according to any one of <1> to <5>, wherein an amount of the neodymium-containing particles contained in the green phosphor is from 10% by mass to 50% by mass relative to an amount of the inorganic phosphor particle in the green phosphor.
<7> The green phosphor according to any one of <1> to <6>, wherein the inorganic phosphor particle contains a base particle and a silicon oxide coating on a surface of the base particle.
<8> The green phosphor according to <7>, wherein a molar ratio (O/Si) of an oxygen atom to a silicon atom in the silicon oxide coating through ICP emission spectroscopy of the green phosphor is 2.60 or less.
<9> The green phosphor according to <7> or <8>, wherein an average thickness of the silicon oxide coating is from 3 nm to 200 nm.
<10> A phosphor sheet including
the green phosphor according to any one of <1> to <9>.
<11> A light-emitting device including
the phosphor sheet according to <10>.

Advantageous Effects of the Invention

According to the present invention, it is possible to provide a green phosphor having high color purity, and a phosphor sheet and a light-emitting device each using the green phosphor.

DESCRIPTION OF EMBODIMENTS (Green Phosphor)

A green phosphor of the present invention includes an inorganic phosphor particle and neodymium-containing particles, and if necessary further includes other components.

The green phosphor has a light-emission local maximum wavelength in the range of from 500 nm to 570 nm. This local maximum wavelength is also the 3.0 light-emission maximum wavelength of the green phosphor.

A proposed method for increasing color purity of a phosphor is a technique of attaching a neodymium (Nd) compound to a trivalent europium ($Eu^{3+}$)-activated rare earth borate phosphor (see Japanese Patent Application Laid-Open (JP-A) No. 2009-280773). In this proposed method, a neodymium (Nd) compound having an absorption wavelength region, for example, the range of from about 460 nm to about 480 nm, the range of from about 510 nm to about 530 nm, and the range of from about 580 nm to about 610 nm, is attached to a $(Y, Gd)BO_3:Eu^{3+}$ phosphor having a strong orange light emission peak around 592 nm, in addition to red light emissions around 610 nm and around 626 nm (see paragraphs [0020] and [0021] in JP-A No. 2009-280773). By doing so, the peak around 592 nm is suppressed as a result of absorption by the filter effect of the Nd compound. Since almost all the remaining peaks around 610 nm and around 630 nm are not absorbed, the light-emission luminance is almost not impaired, leading to increased color purity (see paragraph [0021] and FIG. 2 in JP-A No. 2009-280773).

In the present invention, although neodymium-containing particles, which are a neodymium (Nd) compound, are attached to a phosphor, a green phosphor having a high color purity is obtained by narrowing the light-emission spectrum of the main peak in the wavelength width of light intended to be used, rather than suppressing the unnecessary light-emission peak as in the technique of JP-A No. 2009-280773.

Figure 1:
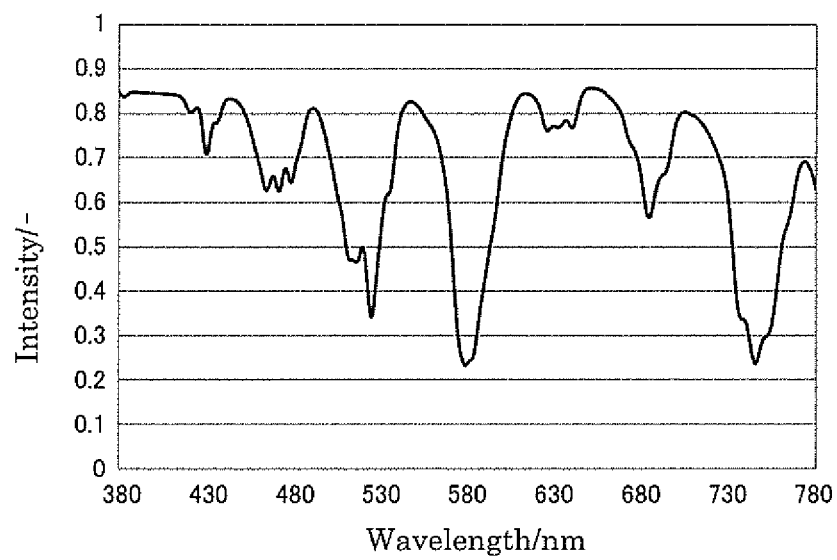
FIG. 1 is a diffuse reflectance spectrum of neodymium hydroxide.

Here, one example of a diffuse reflectance spectrum of the neodymium-containing particles is presented in FIG. 1.

FIG. 1 is a diffuse reflectance spectrum of neodymium hydroxide. As described above, it has absorption wavelength regions, for example, in the range of from about 510 nm to about 530 nm and in the range of from about 580 nm to about 610 nm.

For example, when neodymium hydroxide having the above spectrum is attached onto the surface of the inorganic phosphor particle having a light-emission local maximum wavelength in the range of from 535 nm to 570 nm, the light-emission peak is narrowed to lead to increased color purity as a result of light at bottom portions of the light-emission peak being absorbed in neodymium hydroxide.

The light-emission wavelength region of light absorbed in the neodymium-containing particles may overlap the light-emission local maximum wavelength, if it is a slight extent. In that case, the light-emission local maximum wavelength may be slightly shifted to a longer wavelength side or a shorter wavelength side.

In the green phosphor, the inorganic phosphor particle has a light-emission local maximum wavelength ($\lambda a$) in the range of from 500 nm to 570 nm, and a difference ($\lambda b - \lambda a$) between the light-emission local maximum wavelength ($\lambda b$) of the green phosphor in the range of from 500 nm to 570 nm and the light-emission local maximum wavelength ($\lambda a$) is preferably more than 0 nm but is 10 nm or less, preferably 1 nm or more but 8 nm or less, particularly preferably 2 nm or more but 5 nm or less.

The $\lambda a$ is also a light-emission maximum wavelength of the inorganic phosphor particle.

The light-emission local maximum wavelength ($\lambda b$) of the green phosphor is preferably in the range of from 535 nm to 570 nm, more preferably the range of from 535 nm to 550 nm.

<Inorganic Phosphor Particle>

The inorganic phosphor particle emits green light.

The inorganic phosphor particle includes, for example, a base particle, preferably a silicone oxide coating, and if necessary further include other components such as zinc oxide.

The inorganic phosphor particle may be the base particle itself.

The inorganic phosphor particle preferably has a light-emission local maximum wavelength in the range of from 500 nm to 570 nm in terms of the light-emission peak of itself.

The light-emission local maximum wavelength ($\lambda a$) of the inorganic phosphor particle is preferably from 535 nm to 570 nm, particularly from 535 nm to 550 nm.

Examples of the base particle include a sulfide-based phosphor.

The inorganic phosphor particle includes a base particle represented by any one of General Formula (1) to General Formula (3) below:

$$Sr_{1-x}Ga_2S_4:Eu_x \quad \text{General Formula (1);}$$

$$(Sr_{1-y}Ca_y)_{1-x}Ga_2S_4:EU_x \quad \text{General Formula (2); and}$$

$$(Ba_zSr_{1-z})_{1-x}Ga_2S_4:Eu_x \quad \text{General Formula (3),}$$

where in the General Formulas (1) to (3), x satisfies 0<x<1, y satisfies 0<y<1, and z satisfies 0<z<1.

x preferably satisfies 0.03≤x≤0.20, more preferably 0.05≤x≤0.18.

y preferably satisfies 0.005≤y≤0.45, more preferably 0.05≤y≤0.20.

z preferably satisfies 0.005≤z≤0.45, more preferably 0.20≤z≤0.40.

The base particle is preferably a Eu-activated β-SiALON phosphor particle because a green phosphor having a higher color purity can be obtained.

The β-SiALON phosphor particle is a solid solution of β-silicon nitride in which in a β-silicon nitride crystal, the Si positions are substituted with aluminum (Al) in the solid-solution form and the nitrogen (N) positions are substituted with oxygen (O) in the solid-solution form. The unit cell (unit lattice) of the β-SiALON used in the β-SiALON phosphor particle includes atoms having two formula weights. Thus, a general formula used for the β-SiALON is, for example, $Si_{6-z}Al_zO_zN_{8-z}$. In this general formula, z is a value of greater than 0 but less than 4.2. In the β-SiALON phosphor particle, the β-SiALON forms a solid solution in a very wide range, and preferably the molar ratio (Si, Al)/(N, O) is maintained to be ¾. A typical production method of the β-SiALON is a method of adding silicon nitride as well as silicon oxide and aluminum nitride or aluminum oxide and aluminum nitride, followed by heating.

When the β-SiALON incorporates a light-emitting element such as a rare-earth element (e.g., Eu, Sr, Mn, or Ce) in a crystal structure thereof, the resultant becomes a β-SiALON phosphor that is excited by ultraviolet to blue light to emit green light having a wavelength of from 520 nm to 560 nm. This is preferably used as a green light-emitting component of a phosphor of, for example, a white LED. In particular, a Eu-activated β-SiALON phosphor, which is a β-SiALON phosphor containing europium ($Eu^{2+}$, $Eu^{3+}$), is very sharp in a light emission spectrum. Therefore, it is a material suitable for a backlight source of an image process display device or a liquid crystal display that is required of narrow-width light emission of blue, green, and red colors.

The Eu-activated β-SiALON phosphor particle is represented by, for example, General Formula (4) below.

$$Si_{6-z}Al_zO_zN_{8-z}:Eu \quad \text{General Formula (4)}$$

In the above General Formula (4), z satisfies 0<z<4.2.

The β-SiALON phosphor particle may be a commercially available product. Examples of the commercially available product include NIMS Standard Green available from SIALON Co., Ltd.

<<Silicon Oxide Coating>>

The inorganic phosphor particle may include a base particle and a silicon oxide coating on a surface of the base particle. In this case, the neodymium-containing particles are disposed on a surface of the silicon oxide coating.

Hereinafter, the inorganic phosphor particle including the base particle and the silicon oxide coating on the surface of the base particle may be referred to as "coated phosphor particle".

Inclusion of the silicon oxide coating can provide a green phosphor excellent in durability.

The silicon oxide coating coats a base particle of the inorganic phosphor particle.

As the degree of coating, it is preferable to completely coat the base particle. However, it is not necessary to completely coat the base particle. It is enough for the base particle to be coated to such an extent as to obtain the effect commensurate with the coating.

The silicon oxide coating is not particularly limited and may be appropriately selected depending on the intended purpose as long as it is a coating of silicon oxide. As described below, when the molar ratio of the oxygen atom to the silicon atom is measured through ICP emission spectroscopy of the silicon oxide coating, the molar ratio (O/Si) is different from 2.00, which is the theoretical ratio of $SiO_2$. In this regard, it is not necessary in the present invention that the molar ratio (O/Si) of the oxygen atom to the silicon atom in the silicon oxide coating be 2.00.

The average thickness of the silicon oxide coating is not particularly limited and may be appropriately selected depending on the intended purpose. However, it is preferably from 3 nm to 200 nm, more preferably from 3 nm to 100 nm, further more preferably from 10 nm to 50 nm, particularly preferably from 10 nm to 30 nm.

The average thickness of the silicon oxide coating can be determined, for example, by observing a cross section of the green phosphor using a scanning or transmission electron microscope and measuring the thicknesses of the silicon oxide coating at randomly selected 10 points thereof.

The silicon oxide coating may contain other components as long as the object of the present invention can be achieved. When the silicon oxide coating contains other components, the molar ratio (O/Si) is calculated as a molar ratio (O/Si) of O to Si of the silicon oxide in the silicon oxide coating.

The present inventors conducted extensive studies to provide the coated phosphor particle that is excellent in stability under a high-temperature, high-humidity environment in a state where LEDs are lit.

As a result, they have found that by applying heat to a silicon oxide coating after a base particle has been coated with the silicon oxide coating, the resultant coated phosphor is excellent in stability under a high-temperature, high-humidity environment in a state where LEDs are lit.

They have also found that the molar ratio (O/Si) of the oxygen atom to the silicon atom changes by observing change in the silicon oxide coating before and after the application of heat. This is believed to result from compactness of the silicon oxide coating.

On the basis of the above findings, the present inventors have found that when the molar ratio (O/Si) of the oxygen atom to the silicon atom in the silicon oxide coating through ICP emission spectroscopy of the coated phosphor is 2.60 or less in the coated phosphor particle including the base particle and the silicon oxide coating that coats the base particle, the resultant coated phosphor particle is excellent in stability under a high-temperature, high-humidity environment in a state where LEDs are lit.

The molar ratio (O/Si) of the oxygen atom to the silicon atom in the silicon oxide coating through ICP emission spectroscopy of the green phosphor is preferably 2.60 or less. When the ratio (O/Si) is higher than 2.60, the green phosphor is not increased in stability under a high-temperature, high-humidity environment in a state where LEDs are lit. The lower limit of the ratio (O/Si) is not particularly limited and may be appropriately selected depending on the intended purpose. For example, the ratio (O/Si) may be 2.00 or more or may be 2.30 or more.

The ratio (O/Si) is preferably 2.00 or more but 2.60 or less, more preferably 2.30 or more but 2.55 or less, particularly preferably 2.30 or more but 2.45 or less.

An adjusting method of the molar ratio (O/Si) is, for example, a heating step in the below-described method for producing a coated phosphor particle.

The ratio (O/Si) can be determined through ICP emission spectroscopy.

When performing the ICP emission spectroscopy, a solution in which the entire green phosphor is dissolved may be used as a measurement sample, or the silicon oxide coating is isolated from the green phosphor and a solution in which the isolated silicon oxide coating is dissolved may be used as a measurement sample.

For example, when the alkaline fusion method (JIS R9301-3-3) using sodium carbonate is used, a solution in which the entire green phosphor is dissolved can be used as a measurement sample.

When determining the molar ratio (O/Si), it is necessary to subtract oxygen of the added substances other than silicon oxide, such as the neodymium-containing particles and zinc oxide. In this case, the added substances such as the neodymium-containing particles (e.g., neodymium hydroxide) and zinc oxide are individually measured through ICP (e.g., Nd, Zn, and O are measured), and the oxygen values of the added substances are subtracted from a sample as a blank value.

A method for forming the silicon oxide coating is not particularly limited and may be appropriately selected depending on the intended purpose. Examples of the method include a coating step in the below-described method of the present invention for producing a coated phosphor particle.

The particle diameter D90 of the inorganic phosphor particle is not particularly limited and may be appropriately selected depending on the intended purpose. The particle diameter D90 of the inorganic phosphor particle is preferably 40 µm or less, more preferably 3 µm or more but 30 µm or less, particularly preferably 5 µm or more but 25 µm or less.

As used herein, D90 refers to a value of the particle diameter at which a cumulative value is 90% in a particle size distribution of particles.

<<Zinc Oxide>>

The green phosphor may include zinc oxide. The zinc oxide is disposed on the uppermost surface of the inorganic phosphor particle. The zinc oxide is, for example, disposed in the form of a film on the uppermost surface of the inorganic phosphor particle.

When the inorganic phosphor particle is a sulfide-based phosphor, the zinc oxide can adsorb sulfur-based gas (e.g., hydrogen sulfide) generated from the sulfide-based phosphor, and as a result can prevent corrosion of, for example, an electrode due to sulfur-based gas.

<<Method for Producing Coated Phosphor Particle>>

A method for producing a coated phosphor particle includes a coating step, preferably includes a heating step, and if necessary further includes other steps.

—Coating Step—

The coating step is not particularly limited and may be appropriately selected depending on the intended purpose as long as it is a step of forming a silicon oxide coating on a surface of a base particle to obtain a coated phosphor particle. One example of the coating step is a process including a treatment of immersing the base particles in a liquid containing a silicon oxide precursor and a treatment of heating the base particles including the silicon oxide precursor attached to the surfaces thereof. These treatments may be a so-called hydrolysis of alkoxysilane (the sol-gel process).

Examples of the silicon oxide precursor include alkoxysilane.

The alkoxysilane may be selected from, for example, ethoxide, methoxide, and isopropoxide, and examples thereof include tetraethoxysilane and tetramethoxysilane. The alkoxysilane may be alkoxysilane oligomer such as polyethyl silicate and a hydrolysis-condensation product. The alkoxysilane may be a silane coupling agent having, for example, an alkyl group, an amino group, or a mercapto group that does not contribute to the sol-gel reaction, such as alkylalkoxysilane.

The above liquid may contain a solvent. Examples of the solvent usable include water and an organic solvent.

Examples of the organic solvent usable include alcohol, ether, ketone, and polyvalent alcohols. Examples of the alcohol usable include methanol, ethanol, propanol, and pentanol. Examples of the polyvalent alcohols usable include ethylene glycol, propylene glycol, and diethylene glycol.

These solvents may be used in combination of two or more kinds thereof.

The formation of the silicon oxide coating in the coating step may be performed using a catalyst.

When the silicon oxide precursor is the alkoxysilane, the catalyst is for initiating hydrolysis or polycondensation reaction of the alkoxysilane. For example, an acid catalyst or a basic catalyst can be used. Examples of the acid catalyst include hydrochloric acid, sulfuric acid, boric acid, nitric acid, perchloric acid, tetrafluoroboric acid, hexafluoroarsenic acid, hydrobromic acid, acetic acid, oxalic acid, and methanesulfonic acid. Examples of the basic catalyst include hydroxides of alkali metals such as sodium hydroxide, and ammonia. Among these catalysts, a basic catalyst is preferably used from the viewpoint of effectively preventing degradation of the inorganic phosphor particles. Two or more kinds of these acid catalysts and basic catalysts may be used in combination as the catalyst.

—Heating Step—

The heating step is not particularly limited and may be appropriately selected depending on the intended purpose as long as it is a step of heating the coated phosphor particle at a temperature higher than a formation temperature of the silicon oxide coating and under an inert atmosphere.

The formation temperature of the silicon oxide coating may be, for example, 300° C. or lower, or may be from 100° C. to 250° C.

The lower limit of the temperature in the heating in the heating step is not particularly limited and may be appropriately selected depending on the intended purpose as long as it is a temperature higher than the formation temperature of the silicon oxide coating. The temperature in the heating may be, for example, 500° C. or higher or may be 550° C. or higher.

The upper limit of the temperature in the heating is not particularly limited and may be appropriately selected depending on the intended purpose. From the viewpoint of preventing coalescence of portions of the silicon oxide coating, the temperature in the heating is preferably 1,200° C. or lower, more preferably lower than 1,000° C., particularly preferably lower than 900° C.

Examples of the inert atmosphere include a nitrogen atmosphere.

It is believed that compactness of the silicon oxide coating is achieved by the heating step and the resultant coated phosphor particle has excellent stability under a high-temperature, high-humidity environment in a state where LEDs are lit.

<Neodymium-Containing Particles>

The neodymium-containing particles are attached to the surface of the inorganic phosphor particle.

The neodymium-containing particles are not particularly limited and may be appropriately selected depending on the intended purpose as long as they contain neodymium. Examples of the neodymium-containing particles include neodymium hydroxide [e.g., $Nd(OH)_3$ and $NdO_2H$] particles, neodymium oxide carbonate ($Nd_2O_2CO_3$) particles, and neodymium oxide ($Nd_2O_3$) particles, neodymium aluminate particles, neodymium silicate particles, neodymium vanadate ($NdVO_4$) particles, and neodymium tungstate ($Nd_2W_3O_{12}$) particles.

Examples of neodymium aluminates in the neodymium aluminate particles include $NdAlO_3$, $NdAl_{11}O_8$, $NdAl_{11}O_{18}$, $Nd_{1.65}Al_{23.43}O_{38}$, and $Nd_4Al_2O_9$.

Examples of neodymium silicates in the neodymium silicate particles include $NdSiO_5$, $Nd_2SiO_5$, $Nd_2Si_2O_7$, $Nd_2Si_3O_9$, $Nd_2Si_3O_{12}$, $Nd_4Si_3O_{12}$, and $Nd_{9.33}(SiO_4)_6O_2$.

Among them, it is preferable that the neodymium-containing particles contain at least one of neodymium hydroxide, neodymium oxide carbonate, and neodymium oxide in terms of easiness in narrowing the main peak in the green phosphor.

The average particle diameter of the neodymium-containing particles is not particularly limited and may be appropriately selected depending on the intended purpose. The average particle diameter of the neodymium-containing particles is preferably from 5 nm to 5,000 nm, more preferably from 10 nm to 1,000 nm, particularly preferably from 50 nm to 200 nm.

The average particle diameter of the neodymium-containing particles can be measured by, for example, a dynamic light scattering particle size distribution analyzer (e.g., LB-550 available from HORIBA).

The average particle diameter of the green phosphor is not particularly limited and may be appropriately selected depending on the intended purpose. The average particle diameter of the green phosphor is preferably 0.5 μm or more but 30 μm or less, more preferably 1 μm or more but 20 μm or less, particularly preferably 3 μm or more but 15 μm or less.

The average particle diameter of the green phosphor can be measured by, for example, a laser diffraction particle size distribution analyzer (e.g., LA-960 available from HORIBA).

The particle diameter D90 of the green phosphor is not particularly limited and may be appropriately selected depending on the intended purpose. The particle diameter D90 of the green phosphor is preferably 40 μm or less, more preferably 3 μm or more but 30 μm or less, particularly preferably 5 μm or more but 25 μm or less.

As used herein, D90 refers to a value of the particle diameter at which a cumulative value is 90% in a particle size distribution of particles.

The amount of the neodymium-containing particles in the green phosphor is not particularly limited and may be appropriately selected depending on the intended purpose. When the amount of the neodymium-containing particles therein is small, an obtainable effect of narrowing the width of a light emission peak may be insufficient. When the amount of the neodymium-containing particles therein is too large, there may be a significant decrease in the intensity at the light-emission peak. Therefore, the amount of the neodymium-containing particles is preferably from 1% by mass to 60% by mass, more preferably from 5% by mass to 55% by mass, particularly preferably from 10% by mass to 50% by mass, relative to the amount of the inorganic phosphor particle in the green phosphor.

A method for attaching the neodymium-containing particles on the surface of the inorganic phosphor particle is not particularly limited and may be appropriately selected depending on the intended purpose. Examples of the method include a wet-type method and a dry-type method. The wet-type method is, for example, a method of mixing and stirring the neodymium-containing particles, the inorganic phosphor particles, and a solvent, followed by filtrating and washing.

Now, one example of a particle of the green phosphor of the present invention will be described with reference to the drawings.

Figure 2:
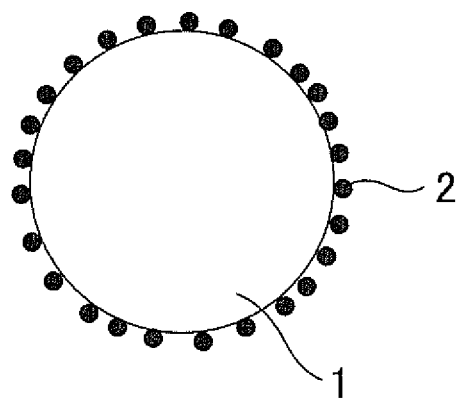
FIG. 2 is a schematic cross-sectional view of one example of a particle of a green phosphor.

FIG. 2 is a schematic cross-sectional view of one example of a particle of the green phosphor.

The particle of the green phosphor illustrated in FIG. 2 includes an inorganic phosphor particle 1 and neodymium-containing particles 2 on the surface of the inorganic phosphor particle 1.

Figure 3:
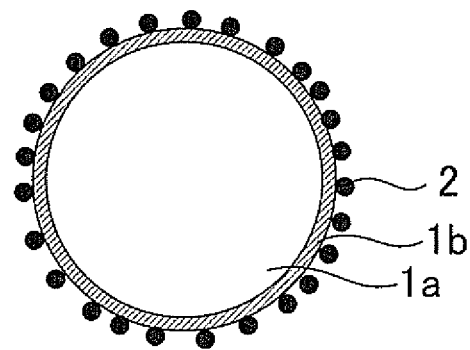
FIG. 3 is a schematic cross-sectional view of another example of a particle of a green phosphor.

FIG. 3 is a schematic cross-sectional view of another example of a particle of the green phosphor.

The particle of the green phosphor illustrated in FIG. 3 includes an inorganic phosphor particle and neodymium-containing particles 2 on the surface of the inorganic phosphor particle. The inorganic phosphor particle includes a base particle 1a and a silicon oxide coating 1b on the surface of the base particle 1a. The neodymium-containing particles 2 are attached to the surface of the silicon oxide coating 1b.

(Phosphor Sheet)

A phosphor sheet of the present invention includes the green phosphor of the present invention, preferably includes a resin, and if necessary further includes other components.

The phosphor sheet can be obtained by, for example, coating a transparent substrate with a phosphor-containing resin composition (a so-called phosphor paint) that contains the green phosphor and the resin.

The thickness of the phosphor sheet is not particularly limited and may be appropriately selected depending on the intended purpose.

The amount of the green phosphor in the phosphor sheet is not particularly limited and may be appropriately selected depending on the intended purpose.

<Resin>

The resin is not particularly limited and may be appropriately selected depending on the intended purpose. Examples of the resin include a thermoplastic resin and a photocurable resin.

<<Thermoplastic Resin>>

The thermoplastic resin is not particularly limited and may be appropriately selected depending on the intended purpose. Examples of the thermoplastic resin include a hydrogenated styrene-based copolymer and an acrylic copolymer.

The hydrogenated styrene-based copolymer is not particularly limited and may be appropriately selected depending on the intended purpose. Examples of the hydrogenated styrene-based copolymer include a hydrogenated product of a styrene-ethylene-butylene-styrene block copolymer.

The proportion of the styrene unit in the styrene-ethylene-butylene-styrene block copolymer is not particularly limited and may be appropriately selected depending on the intended purpose. The proportion of the styrene unit therein is preferably from 20 mol % to 30 mol %.

The acrylic copolymer is not particularly limited and may be appropriately selected depending on the intended purpose. Examples of the acrylic copolymer include a block copolymer of methyl methacrylate (MMA) and butyl acrylate (BA). When the phosphor is a sulfide, the thermoplastic resin is preferably a hydrogenated styrene-based copolymer as compared with an acrylic copolymer.

<<Photocurable Resin>>

The photocurable resin is made using a photocurable compound.

The photocurable resin is not particularly limited and may be appropriately selected depending on the intended purpose. Examples of the photocurable resin include a photocurable (meth)acrylate such as urethane (meth)acrylate. Here, the urethane (meth)acrylate is, for example, a product obtained by esterifying a product containing an isocyanate group obtained through reaction between polyol and polyisocyanate (e.g., isophorone diisocyanate), with hydroxyalkyl (meth)acrylate (e.g., 2-hydroxypropyl acrylate).

The amount of the urethane (meth)acrylate relative to 100 parts by mass of the photocurable (meth)acrylate is not particularly limited and may be appropriately selected depending on the intended purpose. The amount of the urethane (meth)acrylate is preferably 10 parts by mass or more.

<<Resin Composition>>

The resin composition containing the resin preferably contains a polyolefin copolymer component or a photocurable (meth)acrylic resin component.

The polyolefin copolymer is not particularly limited and may be appropriately selected depending on the intended purpose. Examples of the polyolefin copolymer include a styrene-based copolymer and a hydrogenated product of a styrene-based copolymer.

The styrene-based copolymer is not particularly limited and may be appropriately selected depending on the intended purpose. Examples of the styrene-based copolymer include a styrene-ethylene-butylene-styrene block copolymer and a styrene-ethylene-propylene block copolymer. Among them, a hydrogenated product of a styrene-ethylene-butylene-styrene block copolymer is preferable in terms of transparency and gas barrier property. Incorporation of the polyolefin copolymer component makes it possible to provide excellent light fastness and low water absorbability.

When the amount of the styrene unit in the hydrogenated styrene-based copolymer is too low, the mechanical strength tends to decrease. When it is too high, the resultant tends to be brittle. Thus, the amount of the styrene unit in the hydrogenated styrene-based copolymer is preferably from 10% by mass to 70% by mass, more preferably from 20% by mass to 30% by mass. When the hydrogenation rate of the hydrogenated styrene-based copolymer is too low, the weatherability tends to be degraded. Thus, the hydrogenation rate of the hydrogenated styrene-based copolymer is preferably 50% or more, more preferably 95% or more.

The photocurable acrylate resin component is not particularly limited and may be appropriately selected depending on the intended purpose. Examples of the photocurable acrylate resin component include urethane (meth)acrylate, polyester (meth)acrylate, and epoxy (meth)acrylate. Among them, urethane (meth)acrylate is preferable from the viewpoint of heat resistance after photocuring. Incorporation of such a photocurable (meth)acrylate resin component makes it possible to provide excellent light fastness and low water absorbability.

If necessary, the phosphor sheet may contain particles (diffusing materials) such as inorganic substances that absorb a very small amount of light. When the refractive index of the sealing material is different from the refractive index of the particles that are added, those particles diffuse (scatter) excitation light to be able to increase absorption of the excitation light into the green phosphor, which makes it possible to reduce the amount of the green phosphor added. Examples of the particles (diffusing materials) include silicone particles, silica particles, resin particles, and composite particles of melamine and silica. Examples of the resin of the resin particles include melamine, cross-linked polymethyl methacrylate, and cross-linked polystyrene. Specific examples of the above particles (diffusing materials) include commercially available products such as silicone powder KMP series available from Shin-Etsu Chemical Co., Ltd., OPTBEADS available from Nissan Chemical Industries, Ltd., and TECHPOLYMER, MBX series and SBX series available from SEKISUI PLASTICS CO., LTD.

<Transparent Substrate>

The transparent substrate is not particularly limited and may be appropriately selected depending on the intended purpose. Examples of the transparent substrate include a thermoplastic resin film, a thermosetting resin film, and a photocurable resin film (JP-A Nos. 2011-13567, 2013-32515, and 2015-967).

A material of the transparent substrate is not particularly limited and may be appropriately selected depending on the intended purpose. Examples of the material include polyester films such as a polyethylene terephthalate (PET) film and a polyethylene naphthalate (PEN) film; polyamide films; polyimide films; polysulfone films; triacetyl cellulose films; polyolefin films; polycarbonate (PC) films; polystyrene (PS) films; polyether sulfone (PES) films; cyclic amorphous polyolefin films; multifunctional acrylate films; multifunctional polyolefin films; unsaturated polyester films; epoxy resin films; and fluororesin films such as PVDF, FEP, and PFA. These may be used alone or in combination.

Among them, a polyethylene terephthalate (PET) film and a polyethylene naphthalate (PEN) film are particularly preferable.

If necessary, the surface of such a film may be subjected to, for example, a Colona discharge treatment or a silane coupling agent treatment, in order to improve adhesiveness to a phosphor-containing resin composition.

A thickness of the transparent substrate is not particularly limited and may be appropriately selected depending on the intended purpose. The thickness of the transparent substrate is preferably from 10 μm to 100 μm.

Also, the transparent substrate is preferably a moisture barrier film in terms of the ability to reduce hydrolysis of the inorganic phosphor particles.

The moisture barrier film is a gas barrier film obtained by forming a thin film of a metal oxide such as aluminum oxide, magnesium oxide, or silicon oxide on a plastic substrate or film of, for example, PET (polyethylene terephthalate). Alternatively, a multilayered structure such as PET/$SiO_x$/PET may be used.

A moisture transmittance of the barrier film is not particularly limited and may be appropriately selected depending on the intended purpose. The moisture transmittance of the barrier film is preferably about 0.05 $g/m^2/day$ to about 5 $g/m^2/day$ (e.g., a relatively low barrier performance of about 0.1 $g/m^2/day$). When it is within such a range, it is possible to suppress entry of moisture to protect the phosphor sheet from moisture.

Now, one example of the phosphor sheet will be described with reference to the drawings.

Figure 4:
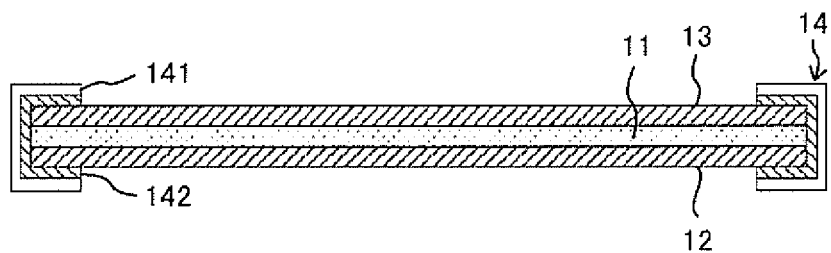
FIG. 4 is a schematic cross-sectional view illustrating an exemplary structure of the end of a phosphor sheet.

FIG. 4 is a schematic cross-sectional view illustrating an exemplary structure of the end of the phosphor sheet. This phosphor sheet includes a phosphor layer 11 sandwiched between a first moisture barrier film 12 and a second moisture barrier film 13.

The phosphor layer 11 includes the green phosphor of the present invention and a resin, where the green phosphor is dispersed in the resin.

In the phosphor sheet of FIG. 4, the end of the first moisture barrier film 12 and the end of the second moisture barrier film 13 are preferably sealed with a cover member 14 having a moisture transmittance of 1 $g/m^2/day$ or less.

The cover member 14 may be an adhesive tape obtained by applying an adhesive 142 to a substrate 141 having a moisture transmittance of 1 $g/m^2/day$ or less. The substrate 141 may be a metal foil such as an aluminum foil, or the moisture barrier films 12 and 13. The aluminum foil may be gloss white aluminum or may be non-gloss black aluminum. Use of white aluminum is preferable when a favorable color tone is needed for the end of the phosphor sheet. A width W of the cover member 14, which is attached onto the moisture barrier film, is preferably from 1 mm to 10 mm, more preferably 1 mm to 5 mm, from the viewpoints of moisture barrier property and strength. The cover member 14 having such a structure can prevent entry of moisture into the phosphor layer from the ends of the moisture barrier films, which makes it possible to prevent degradation of the phosphor in the phosphor layer.

(Light-Emitting Device)

A light-emitting device of the present invention includes the phosphor sheet of the present invention and if necessary further includes other members.

One example of the light-emitting device of the present invention will be described with reference to the drawings.

Figure 5:
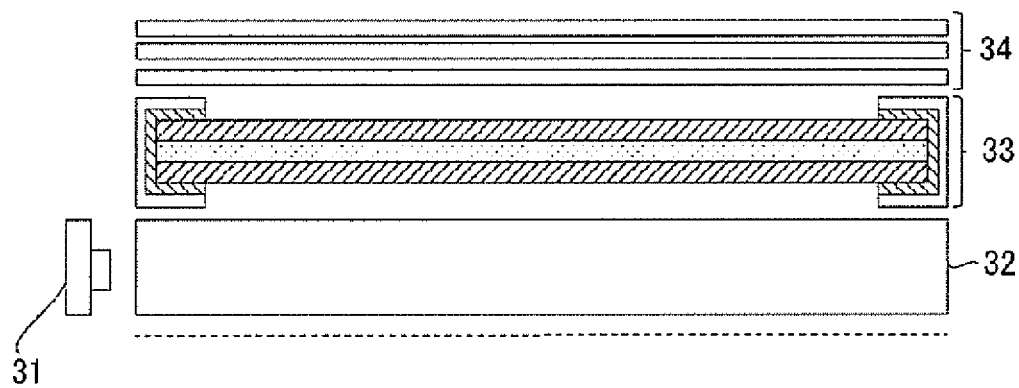
FIG. 5 is a schematic cross-sectional view illustrating an edge-light type light-emitting device.

FIG. 5 is a schematic cross-sectional view illustrating an edge-light type light-emitting device. As illustrated in FIG. 5, the light-emitting device constitutes a so-called "edge-light type backlight" including a blue LED 31, a light-guide plate 32, which is configured to diffuse blue light of the blue LED 31 entering from the side surface thereof and emit uniform light to the surface thereof, a phosphor sheet 33, which is configured to obtain white light from the blue light, and an optical film 34.

The blue LED 31 constitutes a so-called "LED package" including a LED chip such as an InGaN-based chip, as a blue light-emitting element. The light-guide plate 32 is configured to achieve uniform plane emission of light receiving from the end surface of the transparent substrate such as an acrylic plate. The phosphor sheet 33 is, for example, the phosphor sheet illustrated in FIG. 4. Powder of the phosphor used in the phosphor sheet 33 has an average particle diameter of from several micrometers to several tens of micrometers. This makes it possible to increase the light-scattering effect of the phosphor sheet 33. The optical film 34 is composed of, for example, a reflection-type polarizing film and a diffusing film for increasing visibility of a liquid-crystal display device.

Figure 6:
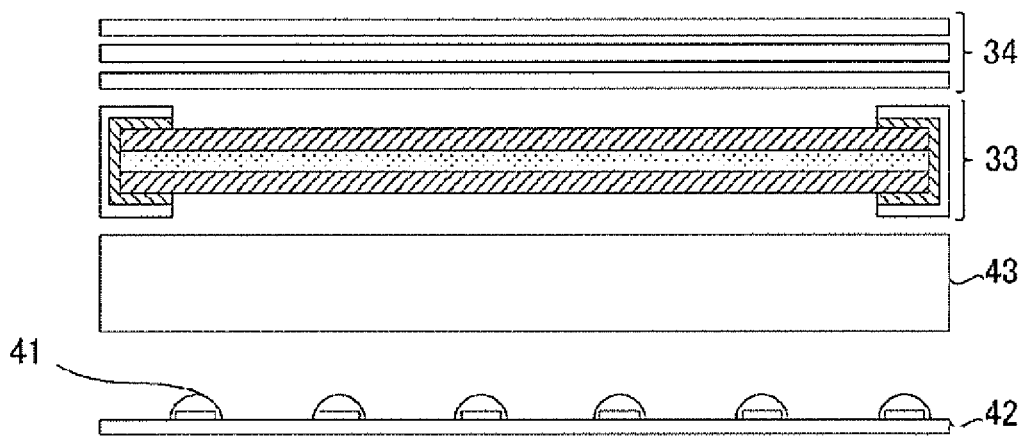
FIG. 6 is a schematic cross-sectional view illustrating a direct-type light-emitting device.

Also, FIG. 6 is a schematic cross-sectional view illustrating a direct-type light-emitting device. As illustrated in FIG. 6, the light-emitting device constitutes a so-called "direct-type backlight" including a substrate 42, where blue LEDs 41 are two-dimensionally arranged, a diffusing plate 43 configured to diffuse blue light of the blue LEDs 41, a phosphor sheet 33 spaced from the substrate 42 and configured to obtain white light from the blue light, and an optical film 34.

The blue LED 41 constitutes a so-called "LED package" including a LED chip such as an InGaN-based chip, as a blue light-emitting element. The substrate 42 is a glass cloth substrate using a resin such as phenol, epoxy, or polyimide. On the substrate 42, the blue LEDs 41 are two-dimensionally arranged at predetermined pitches and equal intervals so as to correspond to the entire surface of the phosphor sheet 33. If necessary, a surface of the substrate 42 on which the blue LEDs 41 are to be mounted may be subjected to a reflective treatment. The substrate 42 and the phosphor sheet 33 are disposed to have a spacing of about 10 nm to about 50 mm. The light-emitting device constitutes a so-called "remote phosphor structure". The gap between the substrate 42 and the phosphor sheet 33 is held with a plurality of is support columns or a reflective plate. The support columns or the reflective plate are provided to surround the entire space formed between the substrate 42 and the phosphor sheet 33. The diffusing plate 43 diffuses radiated light from the blue LEDs 41 to such a wide range that the shapes of the light sources become invisible. The diffusing plate 43 has a total light transmittance of, for example, 20% or higher but 80% or lower.

It is to be noted that the present invention is not limited to only the above-described embodiments, and it is needless to say that various modifications can be made without departing from the gist of the present invention. Although an example in which the light-emitting device is applied to a backlight light source for a display device has been described in the above-described embodiment, the light-emitting device may be applied to an illumination light source. When applied to an illumination light source, the optical film 34 is often unnecessary. The phosphor-containing resin may have not only a shape of a flat sheet but also a three-dimensional shape such as a cup shape.

EXAMPLES

The present invention will next be described by way of Examples. However, the present invention should not be construed as being limited to these Examples.

Production Example 1

<Production of Sulfide Phosphor $SrGa_2S_4$:Eu>

A powdered gallium compound was added to a solution containing a europium compound and a strontium compound, followed by addition of a salt to form a powder (specifically, the salt was added to precipitate the europium compound and the strontium compound to form the powder). After that, the powder was fired. Specifically, a powdered gallium compound was added to a solution containing a europium compound and a strontium compound, and then a salt was added to the resultant to form a powder of a mixture (powder mixture) of a powder containing europium and strontium and the powdered gallium compound. After that, the powder (powder mixture) was fired. Here, a powdered gallium compound was added to a solution containing a europium compound and a strontium compound, and sulfite was added dropwise to the resultant to obtain a powder containing Sr, Eu, and Ga.

Specifically, the following method was performed.

First, $Ga_2O_3$ (purity: 7N), $Sr(NO_3)_2$ (purity: 3N), and $Eu_2O_3$ (purity: 3N), which are reagents available from Kojundo Chemical Lab. Co., Ltd., and an aqueous nitric acid solution (concentration: 20%) and ammonium sulfite monohydrate, which are available from KANTO CHEMICAL CO., INC., were provided.

$Eu_2O_3$ was added to the aqueous nitric acid solution, followed by stirring at 80° C. to dissolve $Eu_2O_3$ in the aqueous nitric acid solution. After that, the solvent was evaporated to obtain $Eu(NO_3)_3$.

Next, the europium compound $[Eu(NO_3)_3]$ and the strontium compound $[Sr(NO_3)_2]$ were added to 500 mL of pure water, followed by stirring. In this manner, a solution containing the europium compound and the strontium compound could be obtained. Changing the proportions of $Eu(NO_3)_3$ and $Sr(NO_3)_2$ can change the value of x to adjust the concentration of Eu as a light emission center. After that, a powdered gallium compound (specifically, powdered $Ga_2O_3$) was added to this solution at a desired proportion, and sulfite was added dropwise to the solution under stirring. Specifically, with this solution being stirred, a solution containing ammonium sulfite of moles 1.5 times the total moles of Sr and Eu was added dropwise, to obtain a deposited and precipitated product. The deposited and precipitated product contains Sr, Eu, and Ga, and is more specifically a mixture of a europium sulfite-strontium powder and a gallium oxide powder. The precipitated product was washed with pure water until the conductivity thereof would be 0.1 mS/cm or lower, followed by filtrating and then drying at 120° C. for 6 hours, to obtain a powder containing europium, strontium, and gallium (a mixture of a gallium oxide powder and a powder mixture of a mixture of the powdered gallium compound and the powder containing europium and strontium (more specifically, a powder of a europium sulfite-strontium powder [a powder of (Sr,Eu)$SO_3$]).

The thus-obtained powder (powder mixture) (20 g), zirconia balls (200 g), and ethanol (200 mL) were placed in a 500-mL pot, followed by mixing through rotation for 30 minutes at 90 rpm. After completion of mixing, the mixture was filtrated and dried at 120° C. for 6 hours. After that, the resultant was allowed to pass through a metal mesh having a nominal opening of 100 μm, to obtain a powder mixture product.

Next, the powder mixture product was fired in an electric furnace. Firing conditions are as follows. Specifically, the temperature was increased to 925° C. for 1.5 hours, then maintained at 925° C. for 1.5 hours, and then cooled to room temperature for 2 hours. During firing, hydrogen sulfide was allowed to flow into the electric furnace at a rate of 0.5 L/min. After that, the resultant was allowed to pass through a mesh having a nominal opening of 25 μm, to obtain a sulfide green phosphor ($SrGa_2S_4$:Eu) of $Sr_{1-x}Ga_2S_4$:$Eu_x$ (x is about 0.1). The obtained sulfide green phosphor ($SrGa_2S_4$:Eu) was found to have an average particle diameter of about 4 μm.

Production Example 2

<Production of Coated Phosphor>

A resin container (PE) was charged with the first formulation [10 g of the sulfide phosphor ($SrGa_2S_4$:Eu) produced in Production Example 1, 80 g of ethanol, 5 g of pure water, and 6 g of 28% aqueous ammonia]. A magnetic stirrer was placed in the first formulation, which was stirred for 10 minutes in a thermostat chamber of 40° C. After that, the second formulation (5 g of tetraethoxysilane and 35 g of ethanol) was added. Regarding as 0 minutes the time the addition of the second formulation was completed, stirring was performed for 3 hours. After completion of stirring, the mixture was treated through aspiration filtration using a vacuum pump, and the recovered sample was transferred to a beaker and washed with water and ethanol. After that, the resultant was filtrated again and the sample was recovered. The recovered sample was dried at 85° C. for 2 hours, followed by firing for 8 hours at 200° C. in the atmospheric environment, to obtain a coated phosphor.

The silicon oxide coating of the obtained coated phosphor was observed with a scanning electron microscope, and the average thickness thereof was 70 nm.

<Annealing>

Subsequently, the coated phosphor was subjected to inert high-temperature annealing under the following conditions using an atmosphere firing furnace.

Amount charged: from 0.2 g to 1.5 g of the coated phosphor

Atmosphere: $N_2$ gas purge

Set temperature: 925° C.

Temperature profile: increased to the set temperature for 90 min, kept at the set temperature for 2 hours, and then naturally cooled After recovery of the particles from the firing furnace, the particles were classified with a mesh having an opening of 62 μm to obtain the coated phosphor subjected to annealing.

Example 1

<Attachment of Neodymium-Containing Particles>

Figure 7:
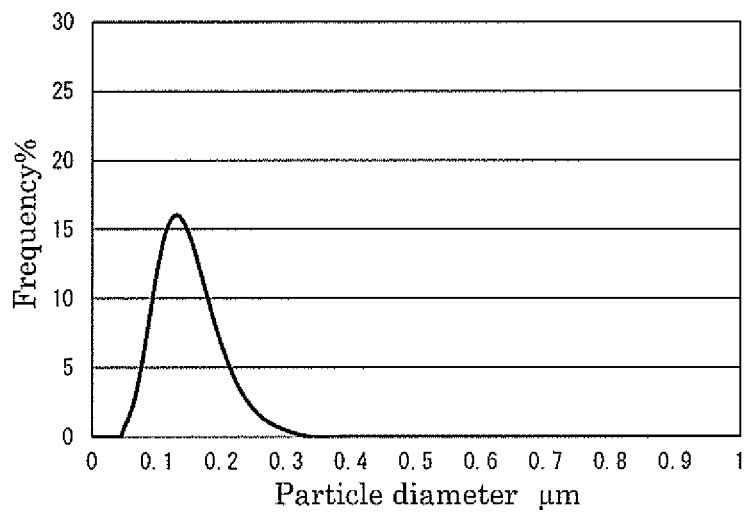
FIG. 7 is a particle size distribution of neodymium hydroxide used in Examples 1 to 4.

The neodymium-containing particles used were neodymium hydroxide [$Nd(OH)_3$, available from Dainichiseika Color & Chemicals Mfg. Co., Ltd., average particle diameter: 100 nm]. The particle size distribution of the neodymium hydroxide used is presented in FIG. 7.

The sulfide green phosphor produced in Production Example 1 (100 parts by is mass) and the neodymium hydroxide (20 parts by mass) were mixed and stirred for 1 hour in the presence of a solvent (isopropyl alcohol), followed by filtrating and washing. After that, the resultant was dried at 80° C. for 2 hours to obtain a phosphor. In the obtained phosphor, as illustrated in FIG. 2, the neodymium-containing particles 2 (neodymium hydroxide) are present on the surface of the inorganic phosphor particle 1. Note that, the total amount of the neodymium hydroxide could be attached to the surface of the sulfide green phosphor.

Comparative Example 1

The sulfide green phosphor produced in Production Example 1 was used as a phosphor of Comparative Example 1.

<Evaluation of Light-Emission Properties>

Evaluation of light-emission properties was performed by light-emission (PL) spectrum measurement. Specifically, a dedicated cell was charged with the phosphor powder, followed by irradiation with blue excitation light having a wavelength of 450 nm, to measure a PL spectrum using a spectrofluorometer FP-6500 (available from JASCO Corporation). The obtained PL spectrum was measured for light-emission peak wavelength (nm), light-emission peak intensity (relative value), and light emission half width (nm) of the peak. Results are presented in Table 1.

The light-emission peak intensity was determined as a relative value to the standard PL spectral data of a typical YAG phosphor P46-Y3 material available from Kasei Optronics (at present, Mitsubishi Chemical Corporation) (Referential Example in Table 1).

As the conversion efficiencies of the phosphor, the following were calculated: a sample absorbance (%), which was an efficiency for absorbing excitation light; an internal quantum yield (%), which was an efficiency for converting the absorbed excitation light to fluorescent light; and an external quantum yield (%), which was a product of them. The internal quantum yield was determined using quantum yield calculation software appended to the above spectrofluorometer.

Figure 8:
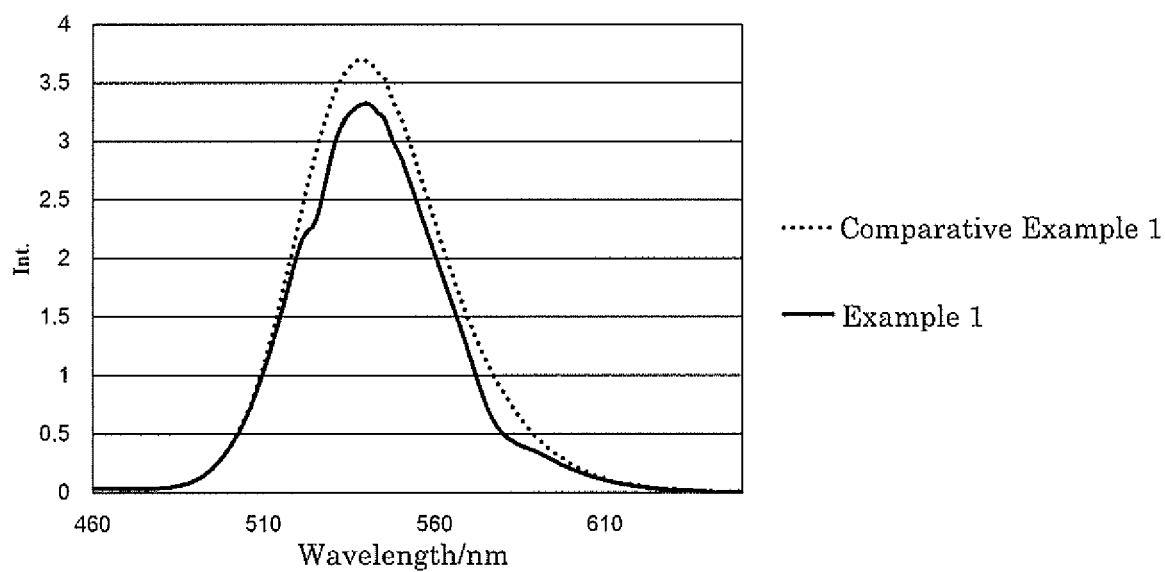
FIG. 8 is light emission spectra of Example 1 and Comparative Example 1.

The light-emission spectra of Example 1 and Comparative Example 1 are presented in FIG. 8.

TABLE 1

|  |  | Referential Example | Comparative Example 1 | Example 1 |
|---|---|---|---|---|
| Neodymium-containing particles | Kind | — | — | Nd(OH)3 |
|  | Average particle diameter | — | — | 100 nm |
|  | Amount | — | — | 20% by mass |
| Silicon oxide coating |  | — | Absent | Absent |
| Chromaticity | x | 0.451 | 0.287 | 0.278 |
|  | y | 0.524 | 0.676 | 0.682 |
| Luminance | Y (with Referential Example being regarded as 100) | 100.0 | 214.9 | 185.7 |
| λp (peak wavelength: cps in vertical axis) |  | 566 nm | 538 nm | 540 nm |
| Peak intensity | YAG ratio (before conversion) | 1.00 | 3.35 | 3.01 |
|  | YAG ratio (after conversion) | 1.00 | 3.70 | 3.33 |
| Half width | FWHM (nm) | 129 nm | 49 nm | 48 nm |
| Peak integrated value (vertical axis: cps) |  | 133.0 | 193.6 | 167.3 |
| Sample absorbance (%) |  | 67.0% | 73.9% | 73.4% |
| Internal quantum yield (%) |  | 69.7% | 92.1% | 80.2% |
| External quantum yield (%) |  | 46.7% | 68.1% | 58.8% |

The following are supplemental explanations for Table 1 to Table 3.

The amount of the neodymium-containing particles is % by mass relative to the amount of the phosphor particle to which they are attached.

x represents an x value of the CIE chromaticity.
y represents a y value of CIE chromaticity.
Y represents a luminance.
FWHM represents a light emission full width at half maximum.

As presented in FIG. 8, the light-emission spectrum of Example 1 is narrower in width than that of Comparative Example 1. Although Example 1 was found to be lower than Comparative Example 1 in terms of the light-emission intensity of the peak top and the quantum yields, the narrowed width is an advantage that outweighs those disadvantages.

Example 2

A phosphor was obtained in the same manner as in Example 1 except that the sulfide green phosphor produced in Production Example 1 used in Example 1 was changed to the coated phosphor subjected to annealing in Production Example 2. In the obtained phosphor, as illustrated in FIG. 3, neodymium-containing particles 2 (neodymium hydroxide) are present outside silicon oxide coating 1*b*.

The phosphor was evaluated for light-emission properties in the same manner as in Example 1. Results are presented in Table 2. The light-emission spectrum is presented in FIG. 9.

Example 3

A phosphor was obtained in the same manner as in Example 2 except that the amount of neodymium hydroxide in Example 2 was changed from 20 parts by mass to 30 parts by mass.

The phosphor was evaluated for light-emission properties in the same manner as in Example 1. Results are presented in Table 2. The light-emission spectrum is presented in FIG. 9.

Example 4

A phosphor was obtained in the same manner as in Example 2 except that the amount of neodymium hydroxide in Example 2 was changed from 20 parts by mass to 40 parts by mass.

The phosphor was evaluated for light-emission properties in the same manner as in Example 1. Results are presented in Table 2. The light-emission spectrum is presented in FIG. 9.

Comparative Example 2

The coated phosphor subjected to annealing produced in Production Example 2 was used as a phosphor of Comparative Example 2.

The coated phosphor was evaluated for light-emission properties in the same manner as in Example 1. Results are presented in Table 2. The light-emission spectrum is presented in FIG. 9.

TABLE 2

|  |  | Ref. Example | Comp. Example 2 | Example 2 | Example 3 | Example 4 |
|---|---|---|---|---|---|---|
| Neodymium-containing particles | Kind | — | — | Nd(OH)3 | Nd(OH)3 | Nd(OH)3 |
|  | Average particle diameter | — | — | 100 nm | 100 nm | 100 nm |
|  | Amount | — | — | 20% by mass | 30% by mass | 40% by mass |
| Silicon oxide coating |  | — | Present | Present | Present | Present |
| Chromaticity | x | 0.451 | 0.278 | 0.272 | 0.271 | 0.271 |
|  | y | 0.524 | 0.682 | 0.685 | 0.686 | 0.686 |
| Luminance | Y (with Referential Example being regarded as 100) | 100.0 | 216.0 | 187.2 | 182.4 | 176.9 |

TABLE 2-continued

| | | Ref. Example | Comp. Example 2 | Example 2 | Example 3 | Example 4 |
|---|---|---|---|---|---|---|
| λp (peak wavelength: cps in vertical axis) | | 566 nm | 537 nm | 540 nm | 540 nm | 541 nm |
| Peak intensity | YAG ratio (before conversion) | 1.00 | 3.43 | 3.07 | 3.01 | 2.95 |
| | YAG ratio (after conversion) | 1.00 | 3.79 | 3.39 | 3.33 | 3.25 |
| Half width | FWHM (nm) | 129 nm | 48 nm | 48 nm | 48 nm | 48 nm |
| Peak integrated value (vertical axis: cps) | | 133.0 | 200.4 | 174.0 | 169.5 | 164.5 |
| Sample absorbance (%) | | 67.0% | 79.7% | 77.2% | 76.9% | 76.2% |
| Internal quantum yield (%) | | 69.7% | 87.2% | 78.2% | 76.5% | 74.8% |
| External quantum yield (%) | | 46.7% | 69.5% | 60.4% | 58.8% | 57.0% |

Figure 9:
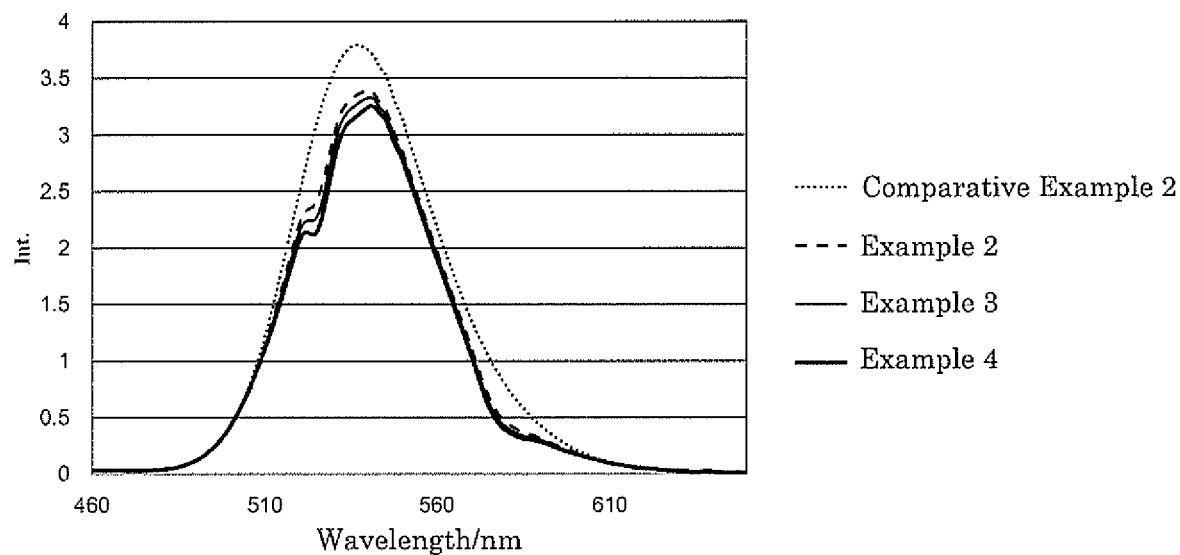
FIG. 9 is light emission spectra of Examples 2 to 4 and Comparative Example 2.

As presented in FIG. 9, the light-emission spectra of Examples 2 to 4 are narrower in width than that of Comparative Example 2. Although Examples 2 to 4 were found to be lower than Comparative Example 2 in terms of the light-emission intensity of the peak top and the quantum yields, the narrowed width is an advantage that outweighs those disadvantages.

Figure 10:
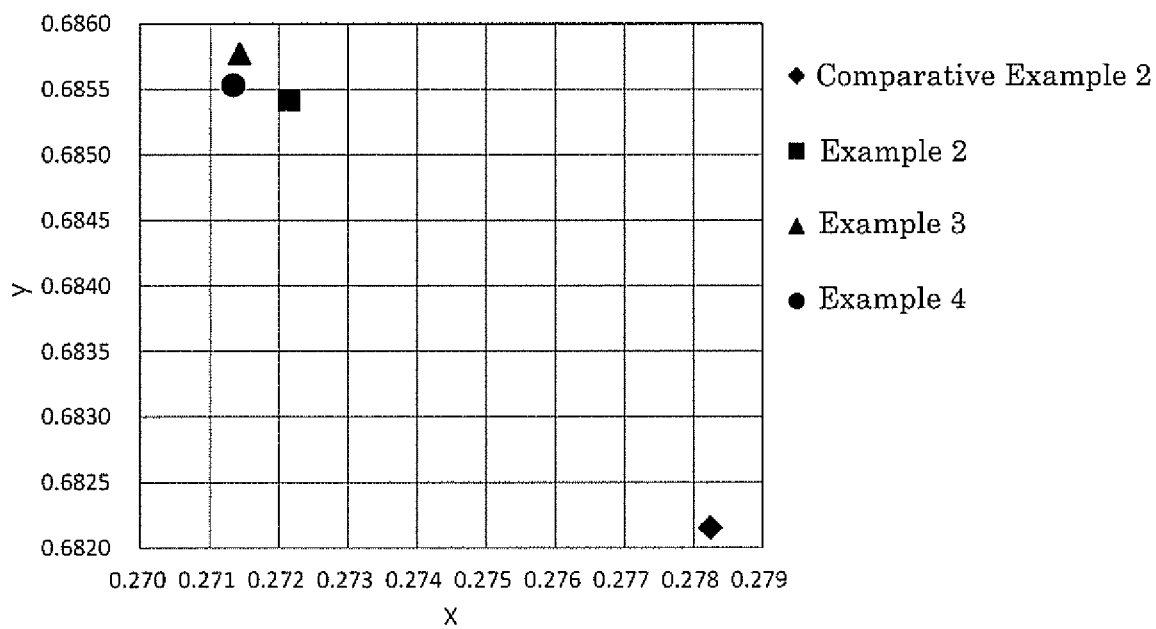
FIG. 10 is a graph in which chromaticity points of Examples 2 to 4 and Comparative Example 2 are plotted.

The chromaticity points of Comparative Example 2 and Examples 2 to 4 are plotted in FIG. 10. As presented in FIG. 10, the chromaticity points of Examples 2 to 4 were shifted to a left-upper region from the chromaticity point of Comparative Example 2. This is advantageous in terms of expansion of a color gamut.

Example 5

Figure 11:
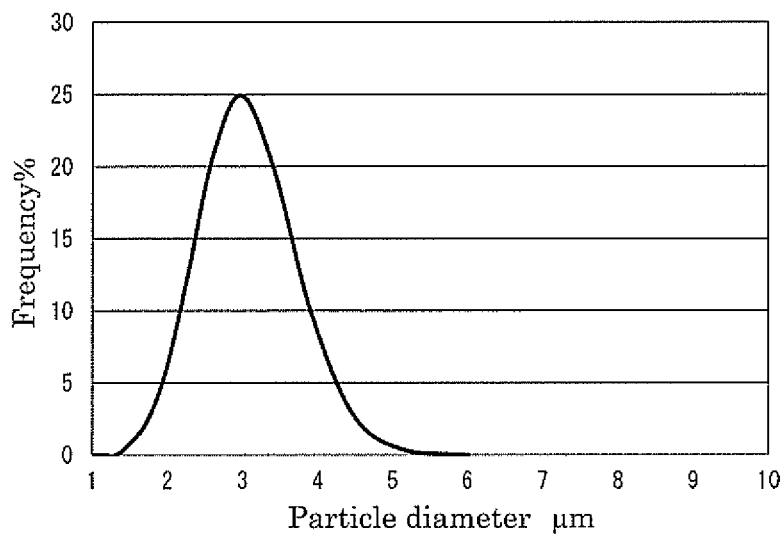
FIG. 11 is a particle size distribution of neodymium oxide carbonate used in Example 5.

A phosphor was obtained in the same manner as in Example 2 except that the neodymium hydroxide (available from Dainichiseika Color & Chemicals Mfg. Co., Ltd., average particle diameter: 100 nm) in Example 2 was changed to neodymium oxide carbonate ($Nd_2O_2CO_3$, available from Dainichiseika Color & Chemicals Mfg. Co., Ltd., average particle diameter: 3 μm). The particle size distribution of the neodymium oxide carbonate used is presented in FIG. 11.

The phosphor was evaluated for light-emission properties in the same manner as in Example 1. Results are presented in Table 3. The light-emission spectrum is presented in FIG. 12.

TABLE 3

| | | Referential Example | Comparative Example 2 | Example 5 |
|---|---|---|---|---|
| Neodymium-containing particles | Kind | — | — | Nd2O2CO3 |
| | Average particle diameter | — | — | 3 μm |
| | Amount | — | — | 20% by mass |
| Silicon oxide coating | | — | Present | Present |
| Chromaticity | x | 0.451 | 0.278 | 0.268 |
| | y | 0.524 | 0.682 | 0.688 |
| Luminance | Y (with Referential Example being regarded as 100) | 100.0 | 216.0 | 173.9 |
| λp (peak wavelength: cps in vertical axis) | | 566 nm | 537 nm | 540 nm |
| Peak intensity | YAG ratio (before conversion) | 1.00 | 3.43 | 2.70 |
| | YAG ratio (after conversion) | 1.00 | 3.79 | 2.99 |

TABLE 3-continued

| | | Referential Example | Comparative Example 2 | Example 5 |
|---|---|---|---|---|
| Half width | FWHM (nm) | 129 nm | 48 nm | 51 nm |
| Peak integrated value (vertical axis: cps) | | 133.0 | 200.4 | 158.0 |
| Sample absorbance (%) | | 67.0% | 79.7% | 76.6% |
| Internal quantum yield (%) | | 69.7% | 87.2% | 73.4% |
| External quantum yield (%) | | 46.7% | 69.5% | 56.2% |

Figure 12:
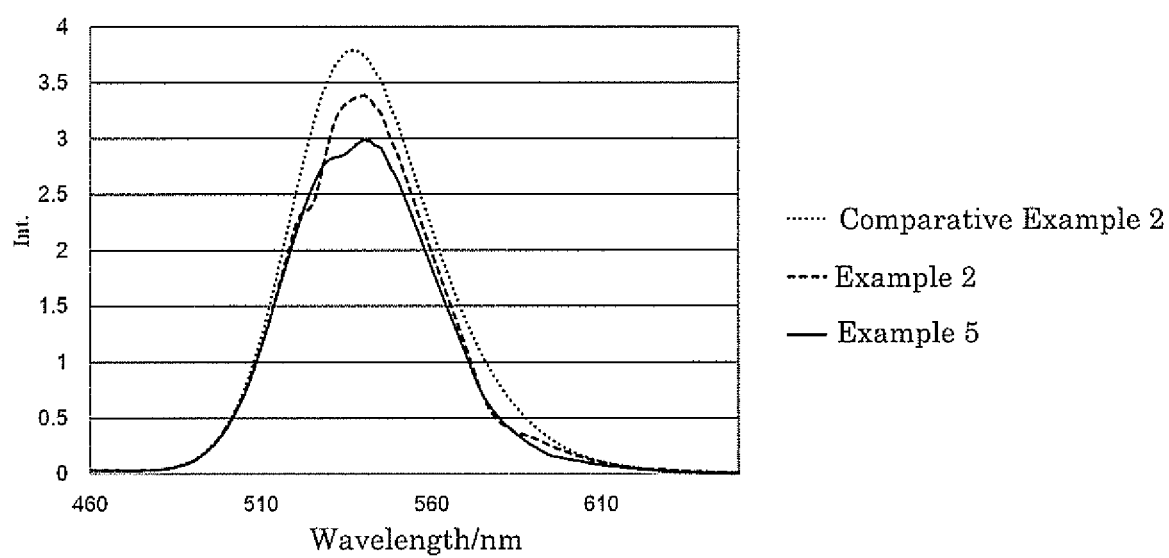
FIG. 12 is light emission spectra of Examples 2 and 5 and Comparative Example 2.

As presented in FIG. 12, the light-emission spectrum of Example 5 is narrower in width than that of Comparative Example 2. Although Example 5 was found to be lower than Comparative Example 2 in terms of the light-emission intensity of the peak top and the quantum yields, the narrowed width is an advantage that outweighs those disadvantages.

<O/Si Amounts>

The coated phosphors of Examples 2 to 5 and Comparative Example 2 were measured for O/Si amounts. The measurement was performed in the following manner.

The coated phosphor (0.05 g) was weighed in a platinum crucible with 0.375 g of sodium carbonate and 0.125 g of boric acid. The mixture was melted by heating at 900° C., followed by cooling. 50% hydrochloric acid (5 mL) and hydrogen peroxide (2 mL) were added to the mixture, and precipitates that formed were recovered. The precipitates were dissolved in a 10% aqueous nitric acid solution to obtain a solution. The solution was subjected to ICP atomic emission spectroscopy (ICP-AES). A ratio of the obtained peak intensities of O (oxygen atom) and Si (silicon atom) was used to determine a molar ratio (O/Si) of O to Si in the coated layer. Results are presented in Table 4.

When determining the molar ratio (O/Si), it is necessary to subtract oxygen of the added neodymium hydroxide or neodymium oxide carbonate. To this end, the neodymium hydroxide alone or the neodymium oxide carbonate alone was measured through ICP for Nd and O, and the value of the oxygen contained in the neodymium hydroxide or the neodymium oxide carbonate was subtracted as a blank value.

TABLE 4

| | Comp. Ex. 2 | Ex. 2 | Ex. 3 | Ex. 4 | Ex. 5 |
|---|---|---|---|---|---|
| Set temperature (° C.) | 925° C. | 925° C. | 925° C. | 925° C. | 925° C. |
| O/Si ratio | 2.46 | 2.45 | 2.48 | 2.45 | 2.49 |

<Reliability Evaluation>

Each of the phosphors of Comparative Example 2 and Examples 2 to 5 was dispersed in a resin (methyl-based KER-2910) in a LED package. The resin was cured to obtain the LED package containing the coated phosphor. This LED package was subjected to a lighting/storage test.

Test conditions were that current was continuously applied at 140 mA for 336 hours to the LED under the 70° C., 85% RH environment. Here, the initial luminous flux maintenance rate (lm %) and chromaticity fluctuation ($\Delta u'v'$) were confirmed.

Details of the measurement are as follows. A light measurement device (available from Labsphere Co., system model name: "CSLMS-LED-1061", Model: 10 inch ($\Phi 25$)/LMS-100) was used to measure a spectrum of spectral radiant flux (intensity: W/nm) with an integrating sphere, and measure the total luminous flux (lumen: lm) and chromaticity points u', v' on the u'v' color space coordinates. After obtaining data before accelerated environmental testing for the above parameters, sample data after accelerated environmental testing for a certain period of time were measured similarly. The obtained values and data were used for the following calculation to calculate the lm fluctuation rate (%) (luminous flux maintenance rate) and the chromaticity fluctuation index ($\Delta u'v'$) from the initial values.

lm fluctuation rate (%): (lm after testing/initial lm)×100
$\Delta u'v'$: $\sqrt{(\Delta u'^2 + \Delta v'^2)}$, where $\Delta u'$=initial u'−u' after the time passed Results of the luminous flux maintenance rate are presented in Table 5.

TABLE 5

|  | Comp. Ex. 2 | Ex. 2 | Ex. 5 |
| --- | --- | --- | --- |
| Set temperature (° C.) | 925° C. | 925° C. | 925° C. |
| Luminous flux maintenance rate | 90.5% | 90.5% | 92.1% |

Results of the chromaticity fluctuation index ($\Delta u'v'$) are presented in Table 6.

TABLE 6

|  | Comp. Ex. 2 | Ex. 2 | Ex. 5 |
| --- | --- | --- | --- |
| Set temperature (° C.) | 925° C. | 925° C. | 925° C. |
| Chromaticity fluctuation index ($\Delta u'v'$) | 0.028 | 0.028 | 0.007 |

When comparing the above results with the below-described Referential Comparative Example, it has been found that when the molar ratio (O/Si) of oxygen atom to silicon atom in the silicon oxide coating is 2.60 or less, the luminous flux maintenance rate is higher and the chromaticity fluctuation is smaller in use under a high-temperature, high-humidity environment in a state where the LEDs are lit, as compared with the case where it is more than 2.60.

In the case of non-lighting, no significant change (reduction) in the luminous flux maintenance rate and the chromaticity fluctuation was observed in both Comparative Examples and Examples.

Referential Examples 1 to 5

As Referential Examples, the following presents the effect of annealing in coated phosphors containing no neodymium-containing particles.

The coated phosphor before annealing obtained in Production Example 2 was subjected to an inert high-temperature annealing under the following conditions using an atmosphere firing furnace.

Amount charged: from 0.2 g to 1.5 g of the coated phosphor
Atmosphere: $N_2$ gas purge
Set temperature: from 600° C. to 900° C.
Temperature profile: increased to the set temperature for 90 min, kept at the set temperature for 2 hours, and then naturally cooled After recovery of the particles from the firing furnace, the particles were classified with a mesh having an opening of 62 μm and were subjected to various evaluations (particle size distribution, SEM, and LED lighting test).

TABLE 7

|  | Set temperature (° C.) |
| --- | --- |
| Ref. Ex. 1 | 600 |
| Ref. Ex. 2 | 750 |
| Ref. Ex. 3 | 825 |
| Ref. Ex. 4 | 850 |
| Ref. Ex. 5 | 900 |

Comparative Referential Example 1

The coated phosphor before annealing obtained in Production Example 2 was used as a coated phosphor of Comparative Referential Example 1.

<O/Si Amounts>

The coated phosphors of Referential Examples 1 to 5 and Comparative Referential Example 1 were measured for O/Si amounts. The measurement was performed in the following manner.

Figure 13:
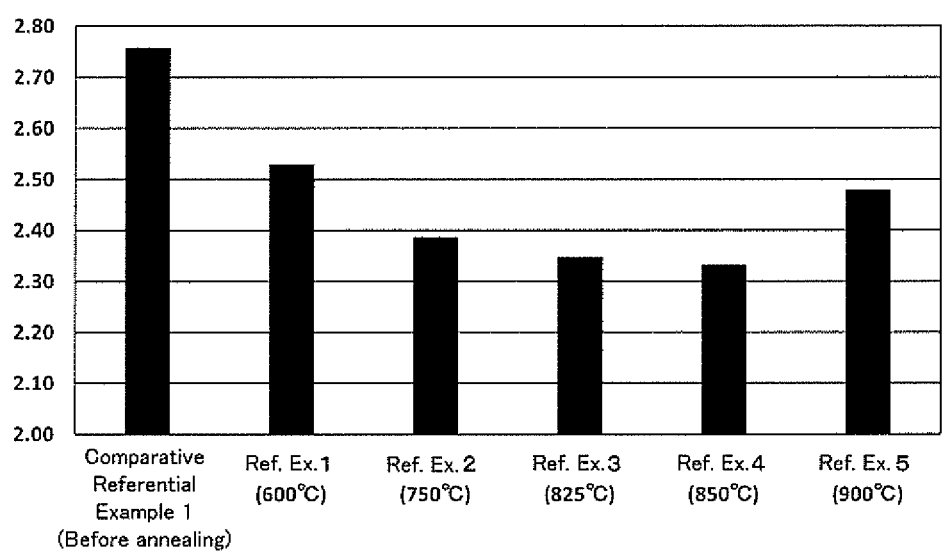
FIG. 13 is a graph of the molar ratio (O/Si) by ICP-AES analysis of the coated phosphors of Referential Examples 1 to 5 and Comparative Referential Example 1.

The coated phosphor (0.05 g) was weighed in a platinum crucible with 0.375 g of sodium carbonate and 0.125 g of boric acid. The mixture was melted by heating at 900° C., followed by cooling. 50% hydrochloric acid (5 mL) and hydrogen peroxide (2 mL) were added to the mixture, and precipitates that formed were recovered. The precipitates were dissolved in a 10% aqueous nitric acid solution to obtain a solution. The solution was subjected to ICP atomic emission spectroscopy (ICP-AES). A ratio of the obtained peak intensities of O (oxygen atom) and Si (silicon atom) was used to determine a molar ratio (O/Si) of O to S in the silicon oxide coating. Results are presented in Table 8 and FIG. 13.

TABLE 8

|  | Comp. Ex. 1 | Ref. Ex. 1 | Ref. Ex. 2 | Ref. Ex. 3 | Ref. Ex. 4 | Ref. Ex. 5 |
| --- | --- | --- | --- | --- | --- | --- |
| Set temperature (° C.) | Before annealing | 600° C. | 750° C. | 825° C. | 850° C. | 900° C. |
| O/Si ratio | 2.76 | 2.53 | 2.39 | 2.35 | 2.33 | 2.48 |

The coated phosphor that had not been subjected to annealing had a molar ratio (O/Si) of O to Si of 2.76, whereas Referential Examples 1 to 5 that had been subjected to annealing had a lower molar ratio (O/Si); i.e., 2.60 or lower.

<SEM Observation>

The coated phosphor was observed with SEM (scanning electron microscope). Results are presented in FIG. 14A to FIG. 14E. The coated phosphor used here was a coated phosphor that had been produced in the same manner as in Production Example 2 so that the silicon oxide coating had a large average thickness of 70 nm. The coated phosphor having the thick silicon oxide coating was produced in Production Example 2 by increasing the concentration of tetraethoxysilane.

Figure 14A:
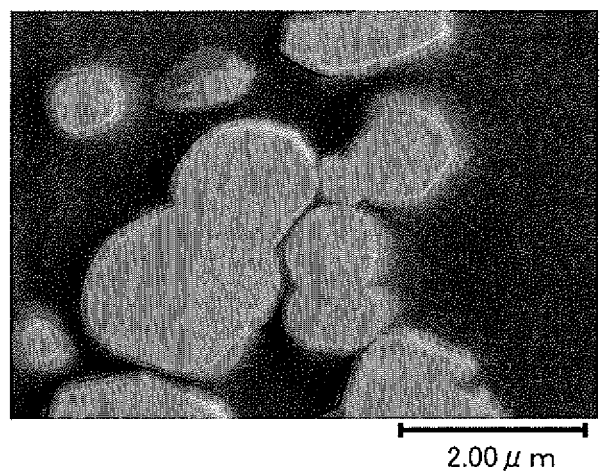
FIG. 14A is a SEM image of the coated phosphor that is not subjected to annealing.

FIG. 14A is a SEM image of the coated phosphor that was not subjected to annealing.

Figure 14B:
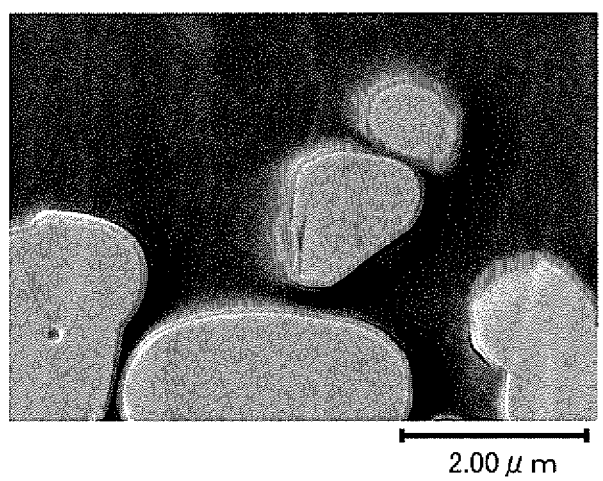
FIG. 14B is a SEM image of the coated phosphor that is subjected to annealing at 600° C.

FIG. 14B is a SEM image of the coated phosphor that was subjected to annealing at 600° C.

Figure 14C:
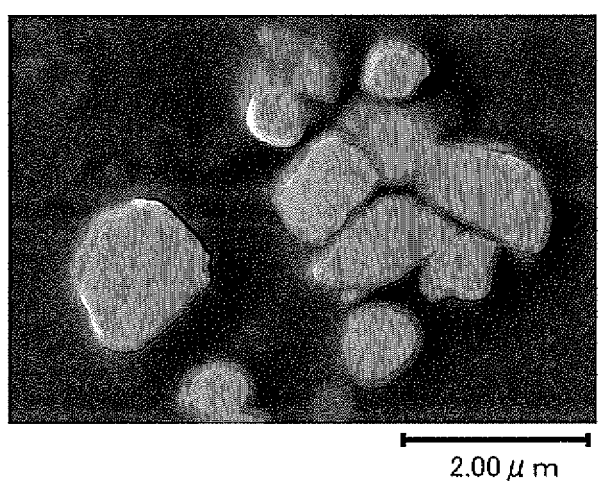
FIG. 14C is a SEM image of the coated phosphor that is subjected to annealing at 700° C.

FIG. 14C is a SEM image of the coated phosphor that was subjected to annealing at 700° C.

Figure 14D:
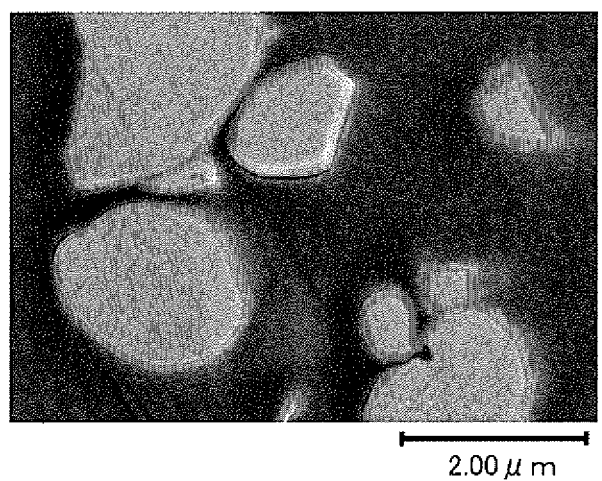
FIG. 14D is a SEM image of the coated phosphor that is subjected to annealing at 800° C.

FIG. 14D is a SEM image of the coated phosphor that was subjected to annealing at 800° C.

Figure 14E:
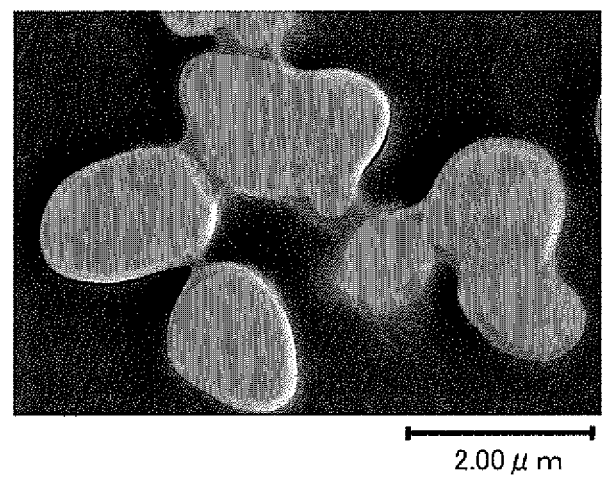
FIG. 14E is a SEM image of the coated phosphor that is subjected to annealing at 900° C.

FIG. 14E is a SEM image of the coated phosphor that was subjected to annealing at 900° C.

When the annealing temperature was 900° C., coalescence of portions of the silicon oxide coating could be confirmed (FIG. 14E).

When the annealing temperature was lower than 900° C., no coalescence was observed. As in Table 8, however, the O/Si decreased even at an annealing temperature of lower than 900° C. It is considered that compactness of the silicon oxide coating occurs even at a temperature of 900° C. or lower.

<Reliability Evaluation>

The coated phosphor before annealing obtained in Production Example 2 was subjected to annealing in the same manners as in Referential Examples 1 to 5. The annealing temperature was set to 600° C., 700° C., 800° C., and 900° C.

The coated phosphor after the annealing or the coated phosphor of Comparative Referential Example 1 was dispersed in a resin (methyl-based KER-2910) in a LED package. The resin was cured to obtain the LED package containing the coated phosphor. This LED package was subjected to a lighting/storage test.

Test conditions were that current was continuously applied at 140 mA for 504 hours to the LED under the 70° C., 85% RH environment. Here, the initial luminous flux maintenance rate (lm %) and chromaticity fluctuation (Δu'v') were confirmed. In addition, the initial luminous flux maintenance rate (lm %) and chromaticity fluctuation (Δu'v') were also confirmed when the LED was stored for 504 hours under the 70° C., 85% RH environment with no current applied (non-lighting state).

Details of the measurement are as follows. A light measurement device (available from Labsphere Co., system model name: "CSLMS-LED-1061", model: 10 inch (Φ25)/LMS-100) was used to measure a spectrum of spectral radiant flux (intensity: W/nm) with an integrating sphere, and measure the total luminous flux (lumen: lm) and chromaticity points u', v' on the u'v' color space coordinates. After obtaining data before accelerated environmental testing for the above parameters, sample data after accelerated environmental testing for a certain period of time were measured similarly. The obtained values and data were used for the following calculation to calculate the lm fluctuation rate (%) (luminous flux maintenance rate) and the chromaticity fluctuation index (Δu'v') from the initial values.

lm fluctuation rate (%): (lm after testing/initial lm)×100

Δu'v': $\sqrt{(\Delta u'^2 + \Delta v'^2)}$, where Δu'=initial u'−u' after the time passed Results of the luminous flux maintenance rate are presented in Table 9-1 and Table 9-2 and FIG. 15A and FIG. 15B.

Figure 15A:
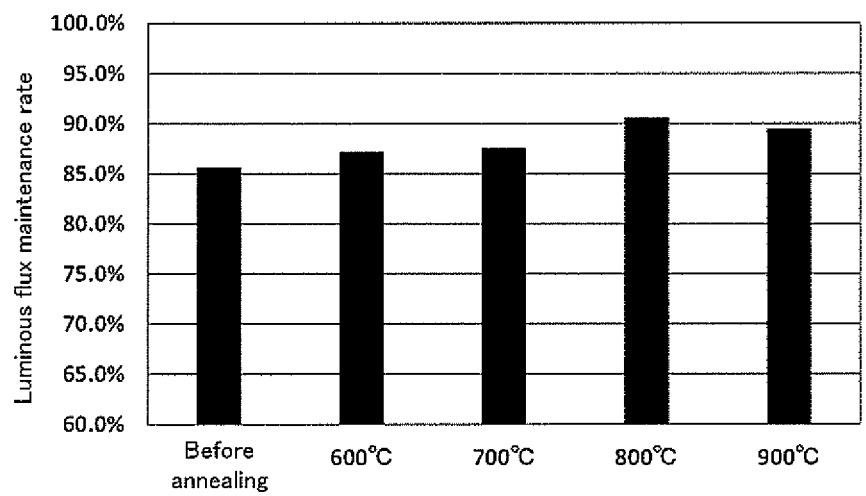
FIG. 15A is a graph of results of a luminous flux maintenance rate when current is applied at 140 mA in a reliability test.

Table 9-1 and FIG. 15A are the results obtained when current was applied at 140 mA.

Figure 15B:
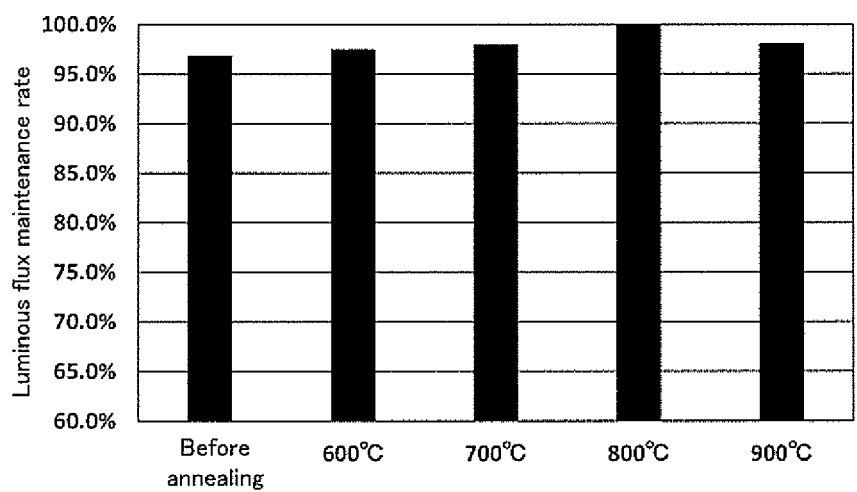
FIG. 15B is a graph of results of a luminous flux maintenance rate in the case of storage (non-lighting state) in a reliability test.

Table 9-2 and FIG. 15B are the results obtained in the case of storage in the above manner (non-lighting state).

TABLE 9-1

| Set temperature (° C.) | Before annealing | 600° C. | 700° C. | 800° C. | 900° C. |
|---|---|---|---|---|---|
| Luminous flux maintenance rate | 85.6% | 87.2% | 87.6% | 90.6% | 89.5% |

TABLE 9-2

| Set temperature (° C.) | Before annealing | 600° C. | 700° C. | 800° C. | 900° C. |
|---|---|---|---|---|---|
| Luminous flux maintenance rate | 96.9% | 97.5% | 98.0% | 100.1% | 98.1% |

Figure 16A:
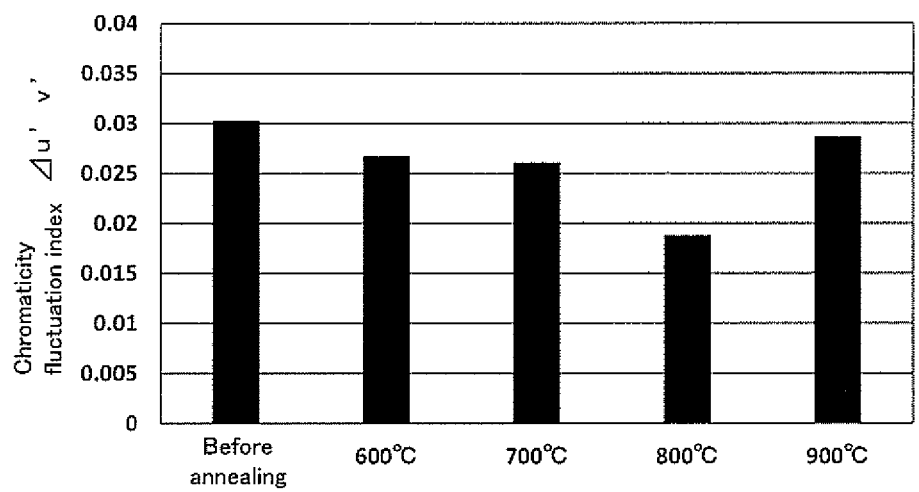
FIG. 16A is a graph of results of a chromaticity fluctuation index when current is applied at 140 mA in a reliability test.
Figure 16B:
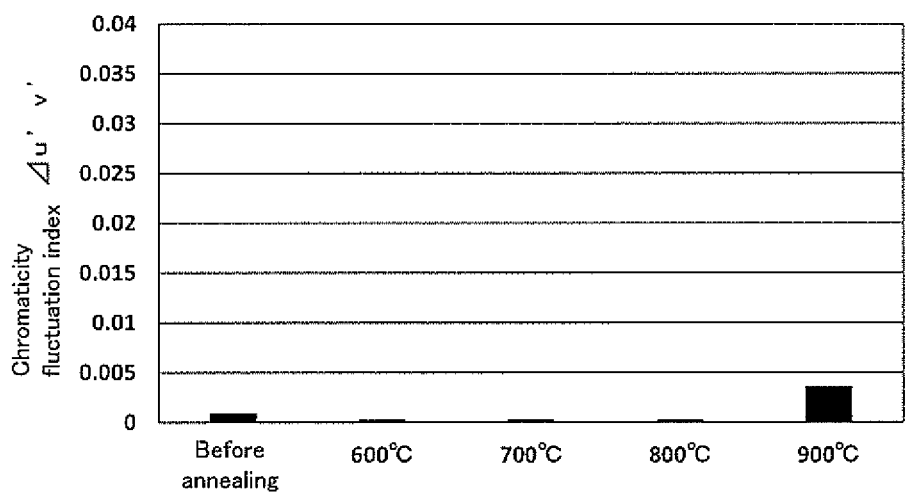
FIG. 16B is a graph of results of a chromaticity fluctuation index in the case of storage (non-lighting state) in a reliability test.

Results of the chromaticity fluctuation index (Δu'v') are presented in Table 10-1 and Table 10-2 and FIG. 16A and FIG. 16B.

Table 10-1 and FIG. 16A are the results obtained when current was applied at 140 mA.

Table 10-2 and FIG. 16B are the results obtained in the case of storage in the above manner (non-lighting state).

TABLE 10-1

| Set temperature (° C.) | Before annealing | 600° C. | 700° C. | 800° C. | 900° C. |
|---|---|---|---|---|---|
| Chromaticity fluctuation index (Δu'v') | 0.0303 | 0.0267 | 0.0261 | 0.0188 | 0.0287 |

TABLE 10-2

| Set temperature (° C.) | Before annealing | 600° C. | 700° C. | 800° C. | 900° C. |
|---|---|---|---|---|---|
| Chromaticity fluctuation index (Δu'v') | 0.0009 | 0.0003 | 0.0003 | 0.0003 | 0.0036 |

From these results, it has been found that when the molar ratio (O/Si) of oxygen atom to silicon atom in the silicon oxide coating is 2.60 or less, the luminous flux maintenance rate is higher and the chromaticity fluctuation is smaller in use under a high-temperature, high-humidity environment in a state where the LEDs are lit, as compared with the case where it is more than 2.60.

In the case of non-lighting, no significant change (reduction) in the luminous flux maintenance rate and the chromaticity fluctuation was observed in both Comparative Referential Examples and Referential Examples.

Example 6

<Materials>

The inorganic phosphor particles used were $Eu^{2+}$-activated β-SiALON phosphor (NIMS Standard Green available from SIALON Co., Ltd.).

The neodymium-containing particles used were neodymium hydroxide [Nd(OH)$_3$, available from Dainichiseika Color & Chemicals Mfg. Co., Ltd., average particle diameter: 100 nm].

The dispersing solvent used was IPA [isopropyl alcohol (2-propanol)] available from Daishin-Chemical, Co., Ltd.

<Attachment of Neodymium-Containing Particles>

The inorganic phosphor particles (Eu$^{2+}$-activated β-SiALON phosphor) (100 parts by mass) and the neodymium hydroxide [Nd(OH)$_3$] (20 parts by mass) were mixed and stirred for 1 hour in the presence of a solvent (IPA), followed by filtrating and washing. After that, the resultant was dried at 80° C. for 2 hours to obtain a green phosphor to which the neodymium-containing particles were attached.

Example 7

A green phosphor to which the neodymium-containing particles were attached was obtained in the same manner as in Example 6 except that the neodymium hydroxide [Nd(OH)$_3$] (20 parts by mass) in Example 6 was changed to neodymium hydroxide [Nd(OH)$_3$] (40 parts by mass).

Comparative Example 3

The Eu$^{2+}$-activated β-SiALON phosphor (NIMS Standard Green available from SIALON Co., Ltd.) was used as a green phosphor of Comparative Example 3.

The phosphors of Examples 6 and 7 and Comparative Example 3 were obtained for various properties in the same manner as in Example 1. Results are presented in Table 11.

TABLE 11

| | | Comparative Example 3 | Example 6 | Example 7 |
|---|---|---|---|---|
| Neodymium-containing particles | Kind | — | Nd(OH)3 | Nd(OH)3 |
| | Average particle diameter | — | 100 nm | 100 nm |
| | Amount | — | 20% by mass | 40% by mass |
| Chromaticity | x | 0.356 | 0.335 | 0.333 |
| | y | 0.625 | 0.643 | 0.644 |
| Luminance | Y (with Comparative Example 3 being regarded as 100) | 100.0 | 72.6 | 66.7 |
| λp (peak wavelength: cps in vertical axis) | | 544 nm | 543 nm | 544 nm |
| Peak intensity (with Comparative Example 3 being regarded as 1.00) | | 1.00 | 0.81 | 0.78 |
| Half width | FWHM (nm) | 55 nm | 46 nm | 42 nm |
| Sample absorbance (%) | | 70.6% | 65.8% | 62.9% |
| Internal quantum yield (%) | | 70.3% | 54.2% | 52.0% |
| External quantum yield (%) | | 49.7% | 35.6% | 32.7% |

The half width in Comparative Example 3 was 55 nm, whereas the half width in Example 6 was 46 nm and the half width in Example 7 was 42 nm. It can be confirmed from Table 11 that Examples 6 and 7 were narrower in half width than Comparative Example 3.

Meanwhile, the yields, peak intensities, and the like decrease with increasing of the amount of the neodymium-containing particles added. However, the narrowed half width is an advantage that outweighs those disadvantages.

Figure 17:
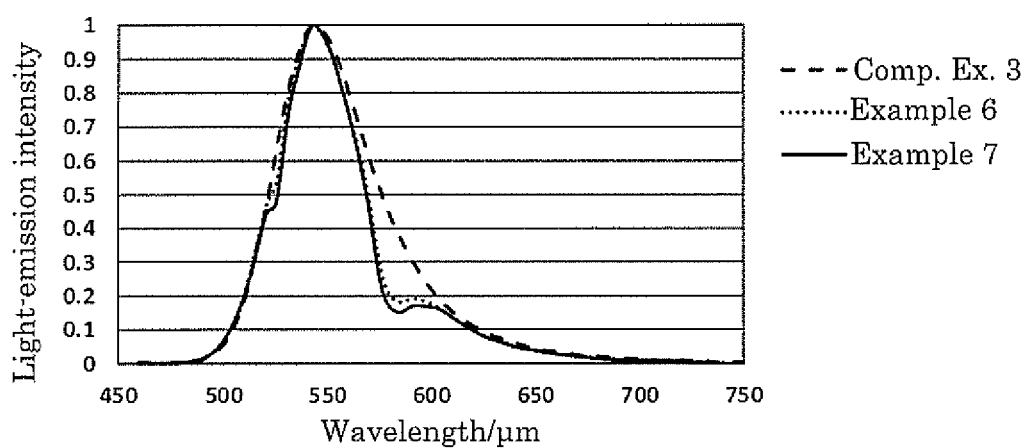
FIG. 17 is light emission spectra of Examples 6 and 7 and Comparative Example 3.

FIG. 17 presents light-emission spectra of the produced samples standardized with the peak intensity. As seen in the light-emission spectra of FIG. 17, it is well understood that Examples 6 and 7 are narrower in half width than Comparative Example 3. The scale of 0.5 in the vertical axis corresponds to the half width. The width there can be confirmed to be narrower in Examples 6 and 7 than in Comparative Example 3.

In addition, it can be confirmed that when the neodymium-containing particles, Nd(OH)$_3$ particles are disposed on the surface of the inorganic phosphor particle, the light emission is attenuated both at the short-wavelength side and at the long-wavelength side. At the scale of 0.5 in the vertical axis at the short-wavelength side of the spectra, Example 6 is still almost the same as Comparative Example 3, but Example 7, in which the width was further narrowed, is more shifted near 530 nm, at which the half width is found to be narrower. Nonetheless, no more shift is not observed at the longer-wavelength side, suggesting that it would be difficult to further narrow the half width even by the addition of the neodymium-containing particles more than this.

INDUSTRIAL APPLICABILITY

The green phosphor of the present invention is excellent in color purity and thus can suitably be used in white LEDs.

REFERENCE SIGNS LIST

1 Inorganic phosphor particle
1a Base particle
1b Silicon oxide coating
2 Neodymium-containing particles

The invention claimed is:

1. A green phosphor comprising:
an inorganic phosphor particle; and
neodymium-containing particles attached on a surface of the inorganic phosphor particle,
wherein the green phosphor has a light-emission local maximum wavelength in a range of from 500 nm to 570 nm, and
wherein an amount of the neodymium-containing particles contained in the green phosphor is from 20% by mass to 50% by mass relative to an amount of the inorganic phosphor particle in the green phosphor.

2. The green phosphor according to claim 1, wherein the inorganic phosphor particle has a light-emission local maximum wavelength (λa) in a range of from 500 nm to 570 nm, and a difference (λb−λa) between the light-emission local maximum wavelength (λb) of the green phosphor in the range of from 500 nm to 570 nm and the light-emission local maximum wavelength (λa) is more than 0 nm but is 10 nm or less.

3. The green phosphor according to claim 1, wherein the inorganic phosphor particle includes a base particle represented by any one of General Formula (1) to General Formula (3) below:

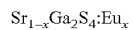  General Formula (1);

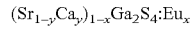  General Formula (2); and

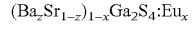  General Formula (3), where in the General Formulas (1) to (3), x satisfies 0<x<1, y satisfies 0<y<1, and z satisfies 0<z≤1.

4. The green phosphor according to claim 1, wherein the inorganic phosphor particle contains a base particle that is a Eu-activated β-SiALON phosphor particle.

5. The green phosphor according to claim 1, wherein the neodymium-containing particles contain at least one selected from the group consisting of neodymium hydroxide, neodymium oxide carbonate, and neodymium oxide.

6. The green phosphor according to claim 1, wherein an amount of the neodymium-containing particles contained in the green phosphor is from 20% by mass to 40% by mass relative to an amount of the inorganic phosphor particle in the green phosphor.

7. The green phosphor according to claim 1, wherein the inorganic phosphor particle contains a base particle and a silicon oxide coating on a surface of the base particle.

8. The green phosphor according to claim 7, wherein a molar ratio (O/Si) of an oxygen atom to a silicon atom in the silicon oxide coating through ICP emission spectroscopy of the green phosphor is 2.60 or less.

9. The green phosphor according to claim 7, wherein an average thickness of the silicon oxide coating is from 3 nm to 200 nm.

10. A phosphor sheet comprising
the green phosphor according, to claim 1.

11. A light-emitting device comprising
the phosphor sheet according to claim 10.

\* \* \* \* \*